US006525382B1

(12) United States Patent
Ishida

(10) Patent No.: US 6,525,382 B1
(45) Date of Patent: Feb. 25, 2003

(54) SEMICONDUCTOR MEMORY DEVICE AND METHOD OF MANUFACTURING THE SAME

(75) Inventor: Minoru Ishida, Tokyo (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/570,560

(22) Filed: May 12, 2000

(30) Foreign Application Priority Data

May 14, 1999 (JP) ............................................. 11-134163
Mar. 6, 2000 (JP) ....................................... 2000-065727

(51) Int. Cl.⁷ .......................... H01L 29/76; H01L 27/11
(52) U.S. Cl. ....................... 257/393; 257/381; 257/383; 257/385; 257/390; 257/903
(58) Field of Search ................................. 257/379, 381, 257/382, 383, 385, 393, 390, 391, 903; 365/156; 438/153, 154

(56) References Cited

U.S. PATENT DOCUMENTS

| | | | | |
|---|---|---|---|---|
| 4,481,524 A | * | 11/1984 | Tsujide | 357/42 |
| 5,166,902 A | * | 11/1992 | Silver | 365/182 |
| 5,518,939 A | * | 5/1996 | Negishi et al. | 437/40 |
| 5,745,404 A | * | 4/1998 | Lien et al. | 365/154 |
| 5,831,898 A | * | 11/1998 | Ishida et al. | 365/156 |
| 5,930,163 A | * | 7/1999 | Hara et al. | 365/154 |
| 6,030,548 A | * | 2/2000 | Kuriyama | 252/368 |
| 6,101,120 A | * | 8/2000 | Ishida | 365/156 |
| 6,147,385 A | * | 11/2000 | Kim et al. | 257/369 |
| 6,157,564 A | * | 12/2000 | Tsutsumi | 365/156 |
| 6,160,298 A | * | 12/2000 | Ohkubo | 257/393 |
| 6,229,186 B1 | * | 5/2001 | Ishida | 257/390 |

FOREIGN PATENT DOCUMENTS

| JP | 6-151776 | * | 5/1994 | .......... H01L/27/11 |
|---|---|---|---|---|
| JP | 6-188388 | * | 7/1994 | .......... H01L/27/11 |

OTHER PUBLICATIONS

A Low Cost, Microprocessor Compatible, 18.4um², 6–T Bulk Cell Technology For High Speed SRAMS, VLSI Symposium Report, pp. 65–66, 1993.

* cited by examiner

Primary Examiner—Tom Thomas
Assistant Examiner—Ori Nadav
(74) Attorney, Agent, or Firm—Rader, Fishman & Grauer PLLC; Ronald P. Kananen, Esq.

(57) ABSTRACT

Provided are a semiconductor memory device and a method of manufacturing the same, in which landing pad layers in correspondence to contacts connecting to a power supply voltage line and a bit line can be easily formed in the same layer as node wiring, thereby simplifying the manufacturing process. Resist patterns having a roughly C shape i.e., patterns of two sets of node wiring are formed not in the same direction in all memory cells but in a different direction from each other between neighboring cells in up-down and right-left directions. Furthermore, out of four sides of each memory cell resist patterns i.e., patterns of the landing pad layer are formed on the two sides opposite the two sides close to the resist patterns for the two sets of node wiring. Accordingly, the landing pad layers can be formed in the same layer as the node wiring, the landing pad layers corresponding to contacts connecting to a grounded line, power supply voltage line and bit line in the upper layer from the node wiring.

12 Claims, 31 Drawing Sheets

SEMICONDUCTOR MEMORY DEVICE AND METHOD OF MANUFACTURING THE SAME

BACKGROUND OF THE INVENTION

1. Field of the Invention

The invention relates to a semiconductor memory device in which memory cells have a CMOS (Complementary Metal Oxide Semiconductor) configuration such as SRAM (Static Random Access Memory) cells having six transistors and the like. Specifically, this invention relates to a semiconductor memory device and a method of manufacturing the same, which are suitable for the split word line type SRAM in which word lines are placed in each word transistor separately.

2. Description of the Related Art

A SRAM cell generally has a latch and two transistors (word transistors). On-off operations of the transistors are controlled based on the voltage applied to a word line and thereby connection between each of two memory nodes of the latch and a bit line is made or broken. The latch is composed of two inverters. An input terminal and output terminal of each of the inverters cross over each other by two sets of node wiring (wirings between memory nodes and gate electrodes) and connect to a bit line.

The SRAM cells can be broadly divided into two types, namely a MOS transistor load type and a high resistance load type, based on a difference in a load element of the latch. The SRAM cells of the MOS transistor load type, configured with six transistors, fall into two types: a P-channel MOS transistor (hereinafter referred to as a pMOS) load type and a TFT (Thin Film Transistor) load type, according to the type of its load transistor.

In recent years, a so-called split word line type SRAM cell in which the word lines are separately placed in each word transistor has been proposed in a "A LOW COST MICRO-PROCESSOR COMPATIBLE, 18.4 $\mu m^2$, 6-T BULK CELL TECHNOLOGY FOR HIGH SPEED SRAMS" (VLSI Symposium report PP65–66, 1993). In the split word line type SRAM cells described in this report, n-type drive transistors are connected in series and word transistors are placed so as to be orthogonal to the n-type drive transistors at both ends of the cell.

In the case of forming this type of SRAM cell, a pattern design determined by the limit of an exposure system is employed in order to realize the minutest cell size. That is, in a conventional type of SRAM cell, two sets of node wiring crossing over each other are simultaneously patterned so that the space between the two sets of node wiring is defined by the limit of exposure of the exposure system, thereby making it impossible to further reduce the cell size.

As one of the techniques to solve the foregoing problems, it is proposed that node wiring of the SRAM cell is patterned separately in two steps (M. Ishida et al, IEDN Tech. Dig., P201, 1998). This technique is used, for example, when node wiring R161$b$ and S161$a$ shown in FIG. 1 are separately formed in different steps. As compared with the conventional technique such that all the node wiring is formed at the same time using a single photo mask, this technique realizes a wiring pattern on a photo mask which has smaller space by the amount that space between resist patterns of the wiring pattern is reduced. As a result, the space between the two sets of node wiring can be made small irrespective of the limit of exposure of the exposure system.

In this type of SRAM cell, it is desirable to provide landing pad layers on contact holes to be connected to a bit line or the like. The landing pad layers are provided so as not to increase a resistance between plugs in case there is a slightly matching shift at the time of forming the contacts for burying upper plugs. To simplify the process, the landing pad layers are preferably formed in the same layer, i.e., in the same step as the node wiring.

However, in the conventional resist patterning described above, each distance between the node wiring and the contacts was small, and thus there was no space so for the landing pad layers to be formed in the same layer as the node wiring layer. Moreover, as illustrated in the FIG. 1, in the conventional pattern, all memory cells are formed consecutively in the same direction. As a result, even if the node wiring is patterned separately in two steps, the landing pad layers are disposed close to both of the two sets of node wiring, thereby making it impossible to form the node wiring and the landing pad layers in the same layers, i.e., in the same step.

The invention has been designed to overcome the foregoing problems. The first object of the invention is to provide a semiconductor memory device which includes landing pad layers in correspondence to contacts connecting a grounded line, power supply voltage line and bit line in the same layer as node wiring, the contacts being capable of functioning even though there exists a slight matching shift when forming the contacts. Consequently, it is possible to simplify the manufacturing process and make high integration feasible.

The second object of the invention is to provide a method of manufacturing a semiconductor memory device which may easily form landing pad layers for contacts connecting to a grounded line, supply line and bit line in the same layer as node wiring, and therefore simplify the manufacturing process and realize high integration as well.

SUMMARY OF THE INVENTION

In a semiconductor memory device according to the invention, two inverters included in each cell, consist of a first conductive drive transistor and a second conductive load transistor to which a common gate is connected, the first conductive drive transistor and the second conductive load transistor being connected in series between a first power supply voltage line to supply a first power voltage and a second power supply voltage line to supply a second power voltage. In the two inverters input terminals and output terminals are connected crossing over each other by two sets of node wiring. Furthermore, in this semiconductor memory device, each pattern of the two sets of node wiring has the same shape in each cell and is disposed in a different direction from each other between neighboring cells.

A method of manufacturing a semiconductor memory device comprises: a step in which a conductive film is first formed to become first node wiring, second node wiring, first landing pad layers and second landing pad layers after which a film having a slower etching rate than the conductive film is formed on the surface of the conductive film: a step of forming etching mask layers by processing the film with the slower etching rate using a pattern of the first node wiring and a pattern of the first landing pad layer; and a step of forming the first node wiring and the second node wiring together with the first landing pad layers and the second landing pad layers, the first node wiring and the second node wiring being formed by processing the conductive film using a pattern of the second node wiring and a pattern of the second landing pad layer while protecting the conductive film disposed immediately below the etching mask layer with the etching mask layer.

In the semiconductor memory device according to the invention, each pattern of the two sets of node wiring is disposed in a different direction between neighboring cells in up-down and right-left directions. As a result, the two sets of node wiring are formed to have the same pattern with a roughly C shape, and are arranged to engage with each other, thereby making it possible to have a configuration in which the landing pad layers are formed of the same conductive material as the node wiring in the same layer as the two sets of wiring.

In the method of manufacturing the semiconductor memory device, the first and second node wiring are formed separately in two different steps. Therefore, space between the node wiring can be made small by the amount that space between resist patterns of node wiring is reduced, and the first landing pad layer and the second landing pad layer are made of the same conductive film as the first and second node wiring. Specifically, the first landing pad layer and the second landing pad layer are formed with a wide margin due to the following arrangement. A pattern of the first node wiring is formed in a roughly C shape and out of four sides of each cell the landing pad layers are disposed on the two sides opposite the two sides close to the first node wiring. Patterns of the first node wiring and the first landing pad layers are disposed in a different direction from each other between neighboring cells. Moreover, a pattern of the second node wiring is shaped in a roughly C shape engaging with the first node wiring, and the second landing pad layers are disposed out of four sides of each cell on the two sides opposite the two sides close to the second node wiring and patterns of the second node wiring and the second landing pad layers are arranged in a different direction from each other between neighboring cells.

Incidentally, in the case where directions of the cell patterns are different in relation to neighboring cells in either up-down or right-left direction, the landing pad layers come close to each of the two sets of node wiring, similar to the conventional case such that directions of all cell patterns are the same. Thus, it is difficult to form the landing pad layers in the same step as the node wiring.

Other and further objects, features and advantages of the invention will appear more fully from the following description.

DETAILED DESCRIPTION OF THE PREFERRED EMBODIMENTS

Embodiments of the present invention will be described below in detail with reference to the accompanying drawings.

The first embodiment

Figure 1:
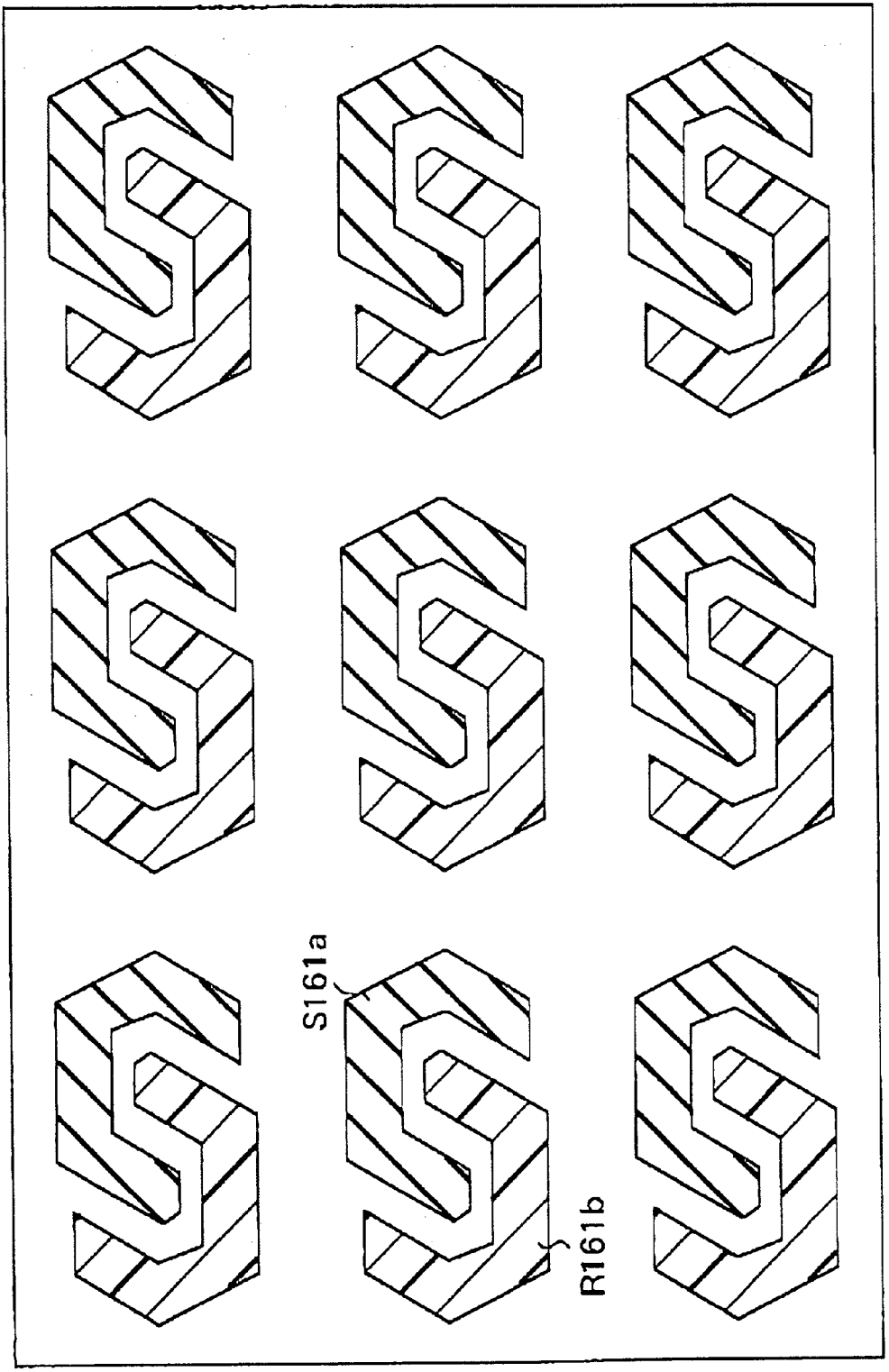
FIG. 1 is a plan view showing a configuration of SRAM cell patterns, explaining the manufacturing process of the related art.
Figure 2:
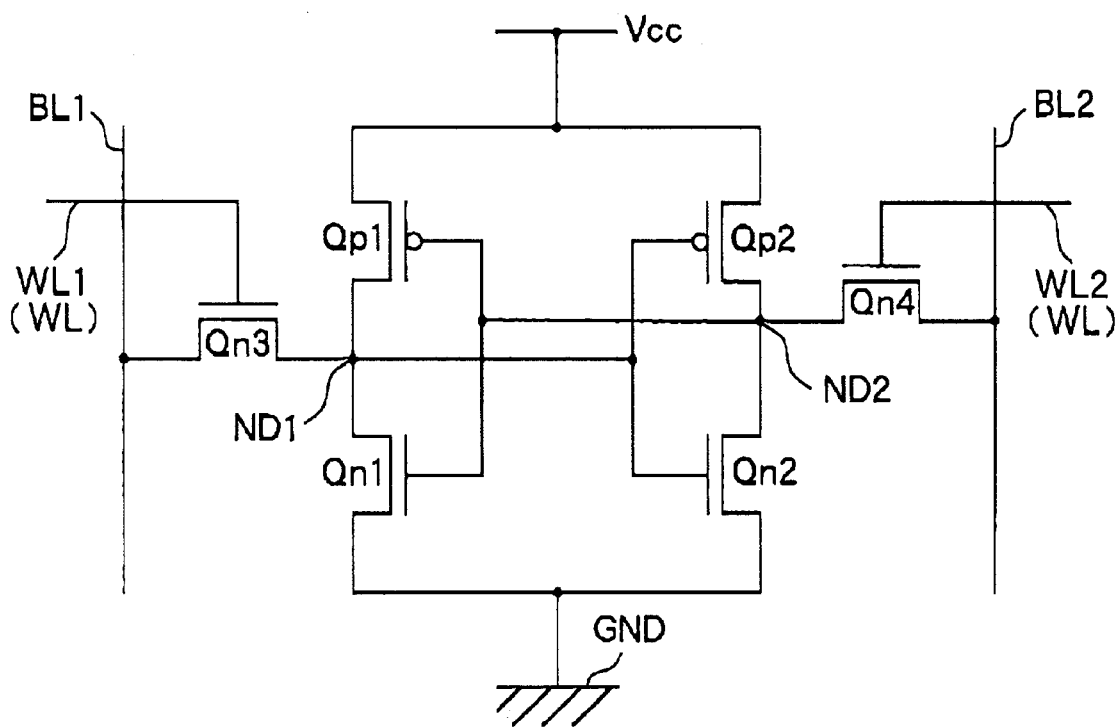
FIG. 2 is a circuit diagram of a SRAM cell according to the invention.

FIG. 2 shows a circuit configuration of a SRAM cell of the split word line pMOS load type having six transistors according to the invention.

The SRAM cell of the pMOS load type includes n-channel MOS transistors (hereinafter referred to as nMOS) Qn1 and Qn2, and p-channel MOS transistors (hereinafter referred to as pMOS) Qp1 and Qp2. The nMOS Qn1 and Qn2 work as drive transistors while the pMOS Qp1 and Qn2 work as load transistors. The pMOS Qp1 and Qp2 as the load transistors, and the nMOS Qn1 and Qn2 as the drive transistors form two inverters. Input terminals of the inverters cross each other; an input terminal of one inverter is connected to an output terminal of another inverter, while an input terminal of the latter inverter is connected to an output terminal of the former inverter.

The nMOS Qn3 and Qn4 are word transistors for controlling the connection of connecting points (memory nodes ND1 and ND2) of each inverter to bit lines BL1 and BL2 based on the voltage applied to word lines WL1 and WL2. This cell configuration is common, and more detailed description of the connection is omitted.

In the SRAM cell of the pMOS load type, one bit line BL1 is maintained at a high potential while a predetermined voltage is applied to the gate of the word transistors Qn3 and Qn4 through word lines WL1 and WL2. Therefore, both transistors Qn3 and Qn4 are turned to ON to accumulate charge in the memory nodes ND1 and ND2. The drive transistors Qn1 and Qn2, and the load transistors Qp1 and Qp2 operate such that, when one memory node is "H(high)", another memory node is "L(low)", as a characteristic of a latch configuration. For example, when the memory node ND1 is "H" and the memory node ND2 is "L", the transistors Qn2 and Qp1 are turned to ON and the transistors Qn1 and Qp2 are turned to OFF. As a result, the memory node ND1 receives charge from a supply line of a source voltage Vcc, and the memory node ND2 is continuously kept at the grounded potential. Conversely, if the memory node ND1 is forced to "L" by turning the word transistor Qn3 to ON when the bit line BL1 potential is "L", or if the memory node ND2 is forced to "H" by turning the word transistors Qn4 to ON when the bit line BL2 potential is "H", the drive transistors Qn1 and Qn2, and the load transistors Qp1 and Qp2 are all inverted, and the memory node ND2 receives charge from the supply line of the source voltage Vcc to keep the memory node ND1 at the grounded potential. In this way, maintaining charge by the latch keeps charge in the memory nodes ND1 and ND2 statically. The potential of "L" of "H" is made to correspond to data of "0" or "1", respectively, so that the data can be stored in six transistors within the cell.

Figure 3A:
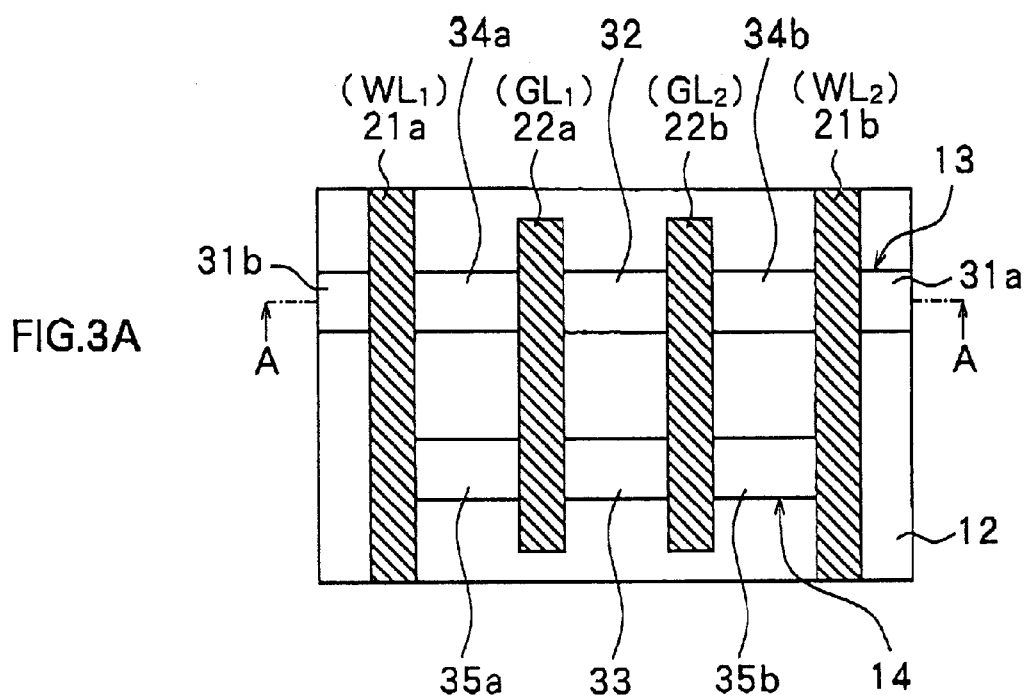
FIG. 3A is a plan view of a SRAM cell pattern, explaining a step in the manufacturing process of SRAM according to the first embodiment of the invention.

FIG. 3A shows a configuration of a basic pattern of the split word line SRAM cell according to the embodiment. A SRAM cell 10 comprises; a p-type active region 13 and n-type active region 14, two word lines 21a and 21b (WL1 and WL2) serving as a gate electrode of the word transistor Qn3 or Qn4 as shown in FIG. 2, a common gate line 22a (GL1) serving as the gate electrode of the drive transistors Qn1 or load transistor Qp1, and a common gate line 22b (GL2) serving as the gate electrode of the drive transistors Qn2 and load transistor Qp2. The p-type active region 13 and n-type active region 14 are disposed in such a manner that each channel current direction of the drive transistor and load transistor is parallel to each other in each memory cell.

The two word lines 21a and 21b are disposed parallel to each other and are orthogonal to the p-type active region 13 near both ends thereof. The common gate lines 22a and 22b placed between the word lines 21a and 21b are orthogonal to both p-type active region 13 and n-type active region 14. The common gates 22a and 22b are placed parallel to each other and spaced equally with the word lines 21a and 21b.

With reference to FIGS. 3A through 15B, a manufacturing process of the SRAM cell of the split word line type having the aforementioned basic pattern will be described. FIGS. 3A through 15A show a plane pattern of the SRAM cell, while FIGS. 3B through 15B show a sectional configuration view taken along the cutting line of FIGS. 3A and 15A. In each of FIGS. 3B through 15, an impurity region in a substrate is omitted.

Figure 3B:
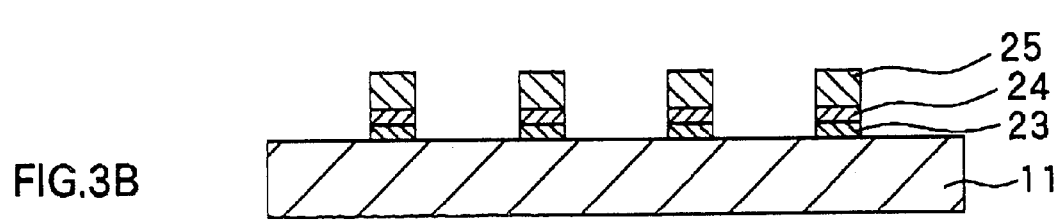
FIG. 3B is a cross sectional view of the SRAM cell pattern taken along the A—A line of FIG. 3A.

In one embodiment, as shown in FIGS. 3A and 3B, firstly, in each memory cell 10, an element separation region 12 of, for example, LOCOS (Local Oxidation of Silicon), trench construction, or the like is formed on the surface, where a p-type well region and n-type well region (not shown) are formed, of a semiconductor substrate 11, e.g., a silicon wafer. By this formation, the surface region of the p-type well region where the element separation region 12 is not formed becomes the p-type active region 13 in which an nMOS channel will be formed, whereas the surface region of the n-type well region where the element separation region 12 is not formed becomes the n-type active region 14 in which a pMOS channel will be formed. Each of the active regions 13 and 14 has a rectangular pattern and is formed parallel to each other.

Next, ion implantation for gate threshold voltage control and for a channel stopper is performed as necessary. After that, a gate oxidation film 23, wiring layer 24, and offset insulation film 25 are formed in sequence on the whole surface. The wiring layer 24 Is formed of, for example, a poly-silicon film and $W_{six}$ (tungsten-silicide) film. The gate oxidation film 23 and offset insulating film 25 are made of oxidation silicon. The poly-silicon film becomes conductive by implanting impurities at the time of forming the film after completing the formation of the film.

Subsequently, the offset insulating film 25, wiring layer 24 and gate oxidation film 23 are consecutively processed using a gate electrode pattern. By this process, the two word lines 21a and 21b (WL1 and WL2), each of which serves as the gate electrode of the word transistors Qp3 or Qn4, the common gate line 22a (GL1) serving as the gate electrode of the drive transistor Qn1 or load transistor Qp1, and the common gate line 22b (GL2) serving as the gate electrode of the drive transistor Qn2 or load transistor Qp2 are formed simultaneously.

The two word lines 21a and 21b are disposed parallel to each other and orthogonal to the p-type active region 13 near both ends thereof. The common gate lines 22a and 22b are disposed between the word lines 21a and 21b and orthogonal to both p-type active region 13 and n-type active region 14. Also, the common gate lines 22a and 22b are spaced uniformly with the word lines 21a and 21b and are disposed parallel to each other. The word lines 21a and 21b, and the common gate lines 22a and 22b are patterned to have a rectangular shape.

Figure 16:
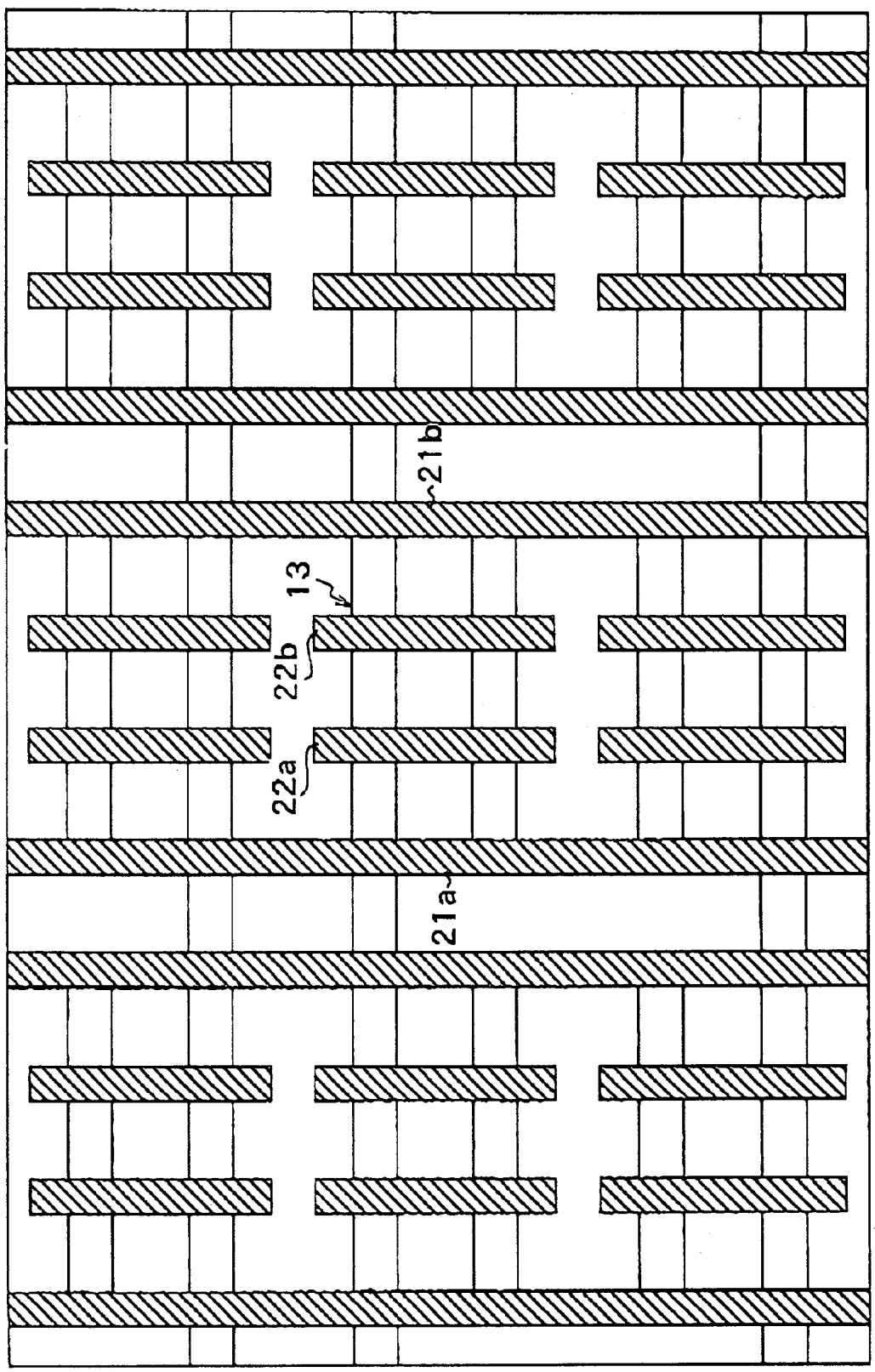
FIG. 16 is a plan view showing the whole SRAM cell patterns as corresponds to the step explained in FIG. 3.

Next, the impurity region to become a source and drain of each transistor is formed by the well-known transistor formation process. Thus, formed are diffusion layer regions 31a and 31b to be connected to the bit lines, a diffusion layer region 32 to be connected to the grounded line, a diffusion layer region 33 to be connected to the power supply voltage line Vcc, diffusion layer regions 34a and 34b to become the n-type memory node, and diffusion layer region 35a and 35b to become the p-type memory node (see FIG. 3A). That is, in the p-type active region 13, the word transistor Qn3, drive transistor Qn1, drive transistor Qn2, and word transistors Qn4 are formed simultaneously connecting in series whereas in the n-type active region 14, the load transistors Qp1 and Qp2 are formed simultaneously connecting in series. FIG. 16 shows the plane configuration of the whole SRAM in this step.

Figure 4A:
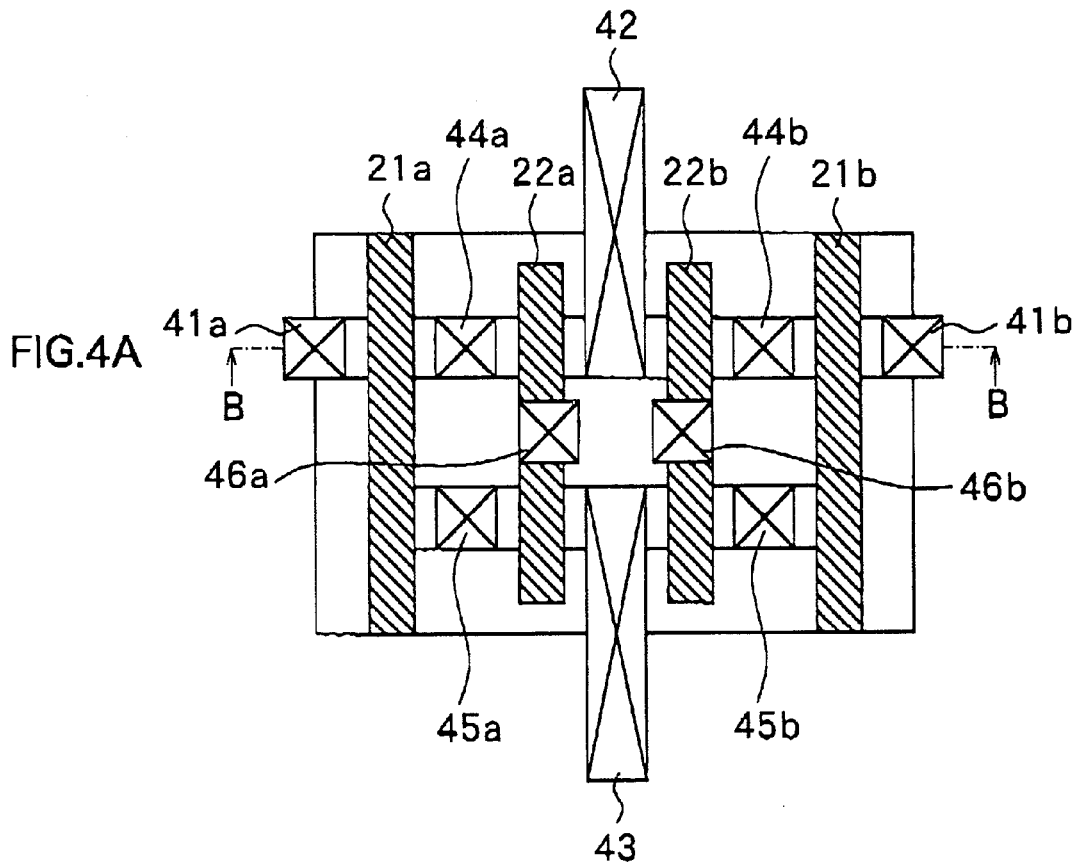
FIG. 4A is the plan view of the SRAM cell pattern, explaining a step following the step explained in FIG. 3A.
Figure 4B:
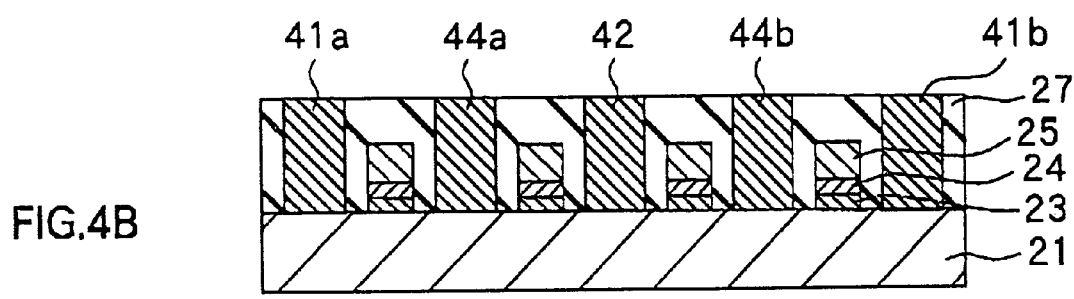
FIG. 4B is a the cross sectional view of the SRAM cell pattern taken along the B—B line of FIG. 4A.

As shown in FIGS. 4A and 4B, a first layer insulating film 27 is formed on the whole surface and, if necessary, the surface thereof is flattened.

Subsequently, bit line contacts 41a and 41b are formed in the diffusion layer regions 31a and 31b to which the bit lines are connected, in such a manner that neighboring memory cells share the bit line contacts 41a and 41b. Further, a grounded line contact 42 is formed in the diffusion layer region 32 to which the grounded line is connected; a power supply voltage line contact 43 is formed in the diffusion layer region 33 to which the power supply voltage line is connected; n-type memory node contacts 44a and 44b are formed in the diffusion layer regions 34a and 34b which become the n-type memory node; and p-type memory node contacts 45a and 45b are formed in the diffusion layer regions 35a and 35b which become the p-type memory node.

The above-described contacts 41a to 45b are formed by a conventional aligned contact method or self aligned contact method. In any step of the contact formation; resist patterns are formed by photolithography and, thereafter, anistropic etching is performed on the first layer insulating film 27 using the resist pattern as a mask.

Figure 17:
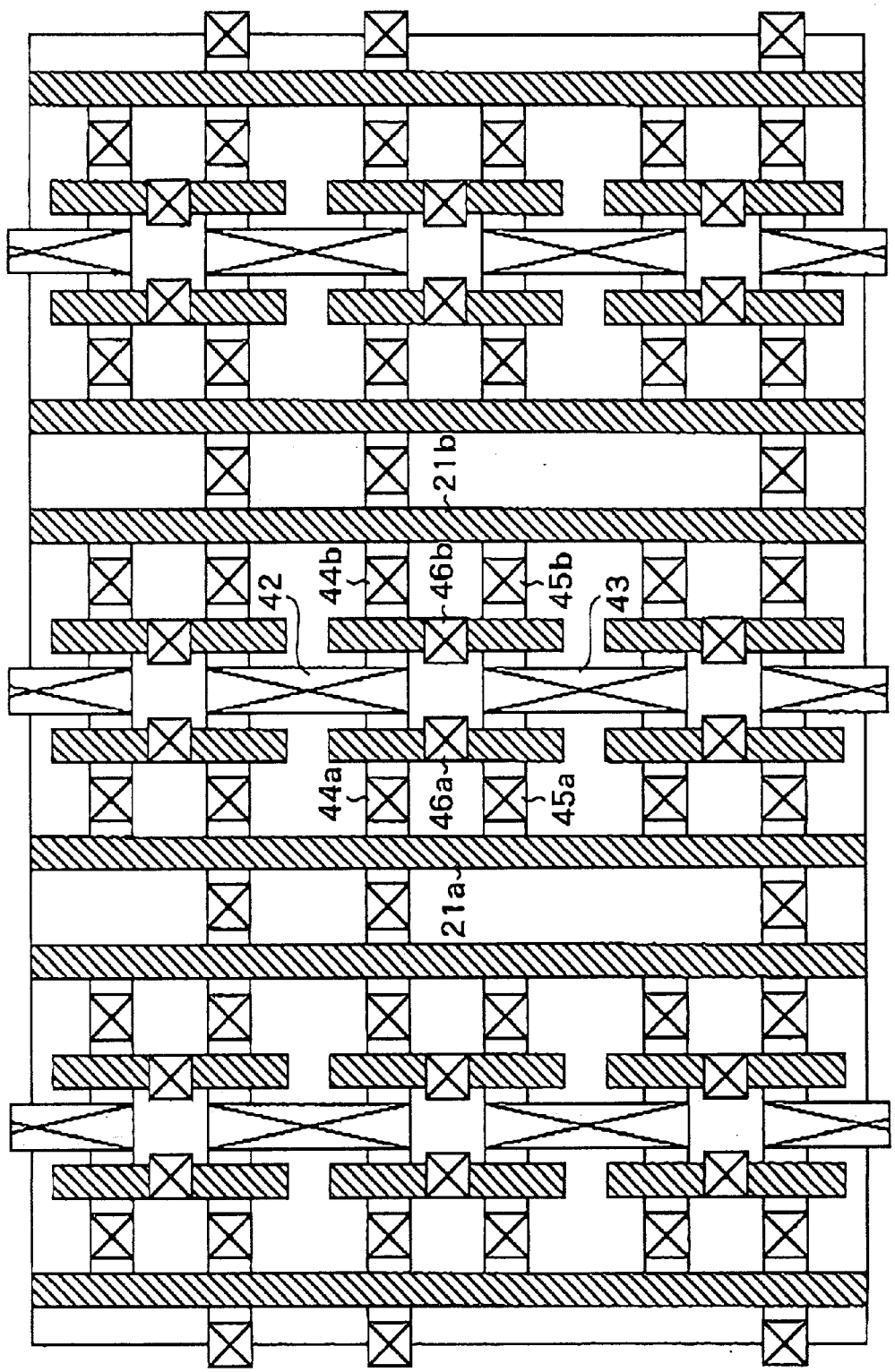
FIG. 17 is a plan view showing the whole SRAM cell patterns as corresponds to the step explained in FIG. 4.

Further, gate electrode contacts 46a and 46b are formed on the common gate lines 22a and 22b to which n-type memory nodes 34a and 34b and p-type memory nodes 35a and 35b are connected. FIG. 17 shows the plane configuration of the whole SRAM in this step.

Figure 5A:
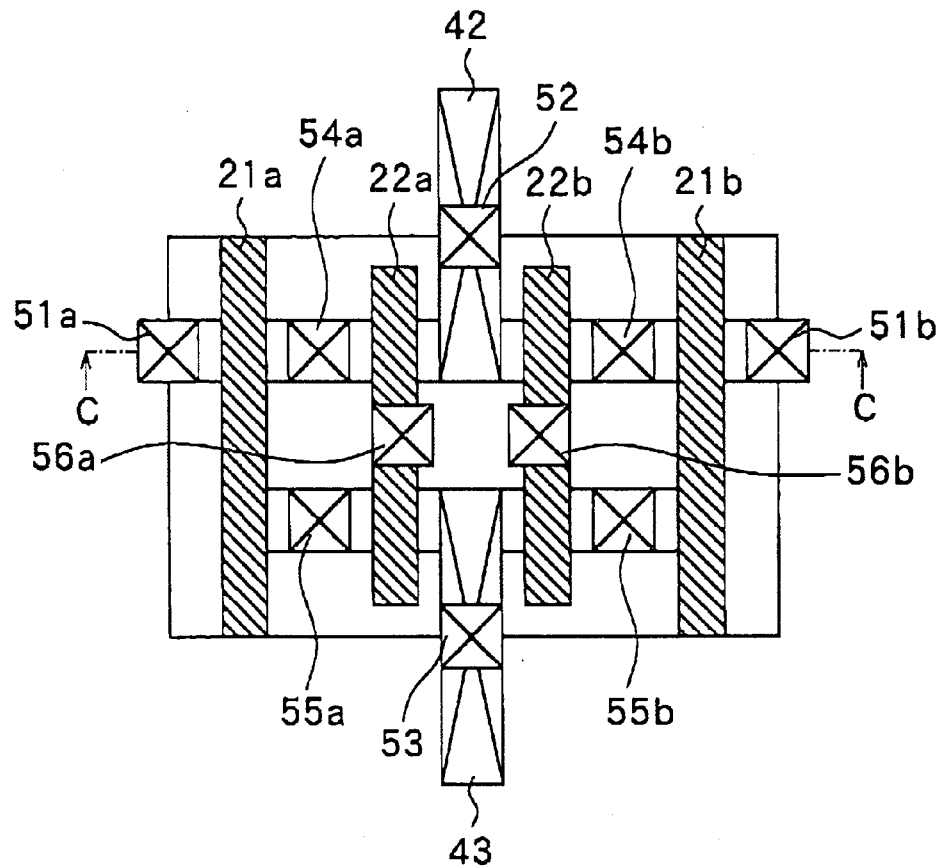
FIG. 5A is a the plan view of the SRAM cell pattern, explaining a step following the step explained in FIG. 4A.
Figure 5B:
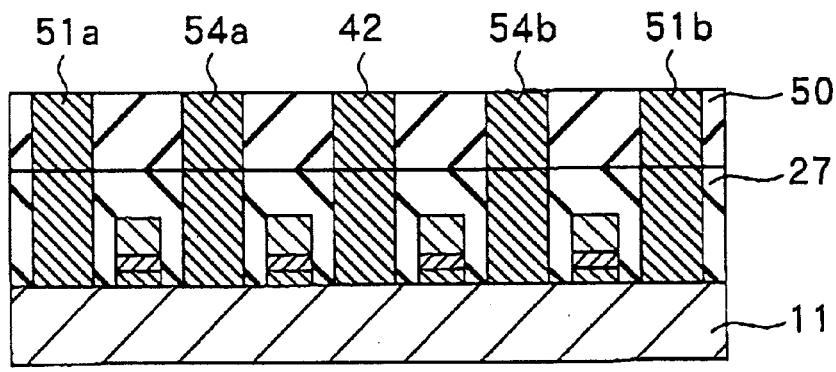
FIG. 5B is the cross sectional view of the SRAM cell pattern taken along the C—C line of FIG. 5A.
Figure 18:
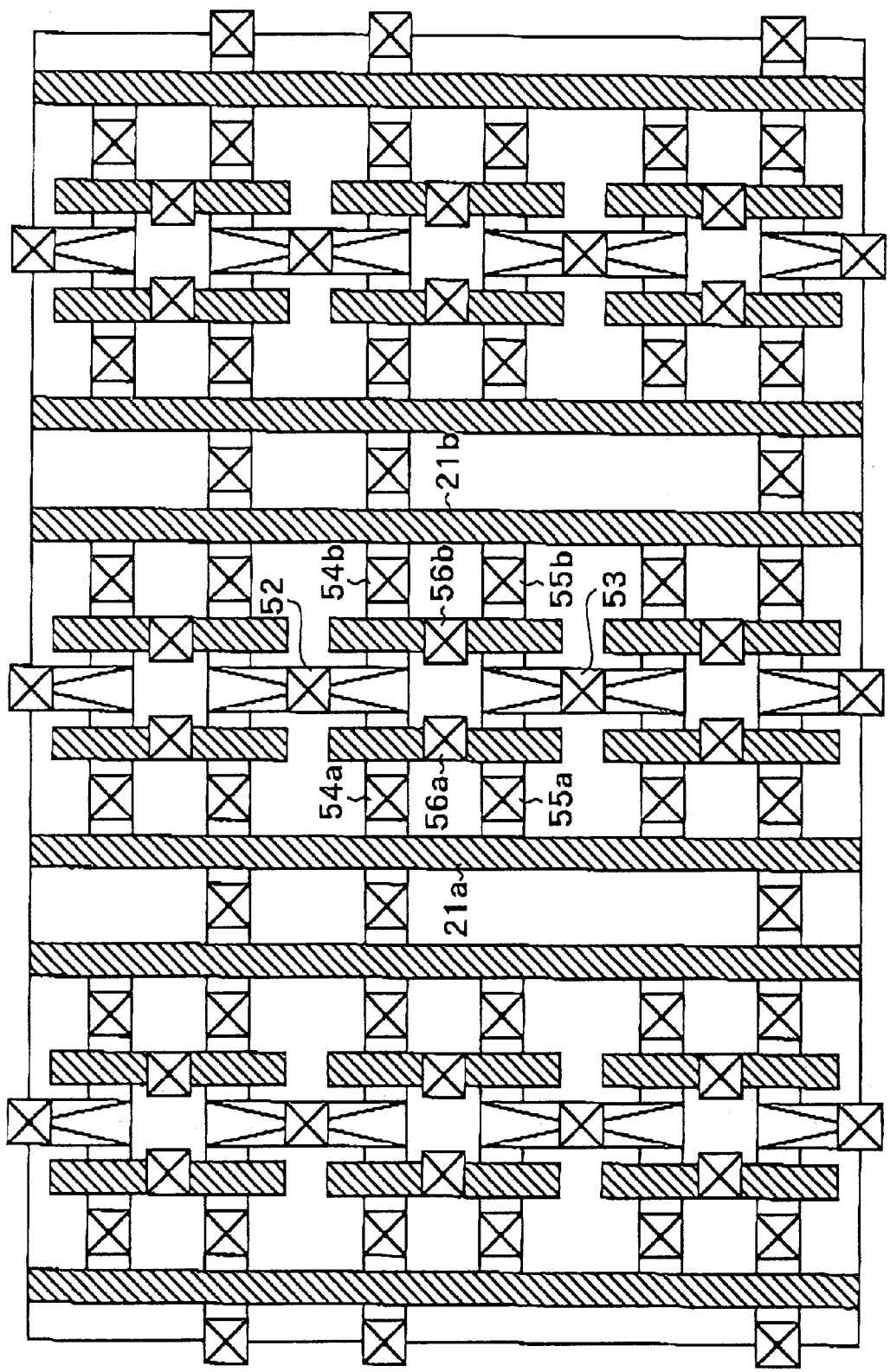
FIG. 18 is a plan view showing the whole SRAM cell patterns as corresponds to the step explained in FIG. 5.

Next, as shown in FIGS. 5A and 5B, a second layer insulating film 50 is formed on the first layer insulating film 27. Subsequently, bit line contacts 51a and 51b are formed in a corresponding position to the bit line contacts 41a and 41b in the second layer insulating film 50. Moreover, a grounded line contact 52 is formed on the grounded line contact 42; a power supply voltage line contact 53 is formed on the power supply voltage line contact 43; memory node contacts 54a and 54b are formed on the n-type memory node contacts 44a and 44b, respectively; and memory node contacts 55a and 55b are formed on the p-type memory node contacts 45a and 45b, respectively. Gate electrode contacts 56a and 56b are formed on the gate electrode contacts 46a and 46b, respectively. The aforementioned contacts 41a to 56b may be formed by a conventional contact formation process. FIG. 18 shows the plane configuration of the whole SRAM in this step.

Figure 6A:
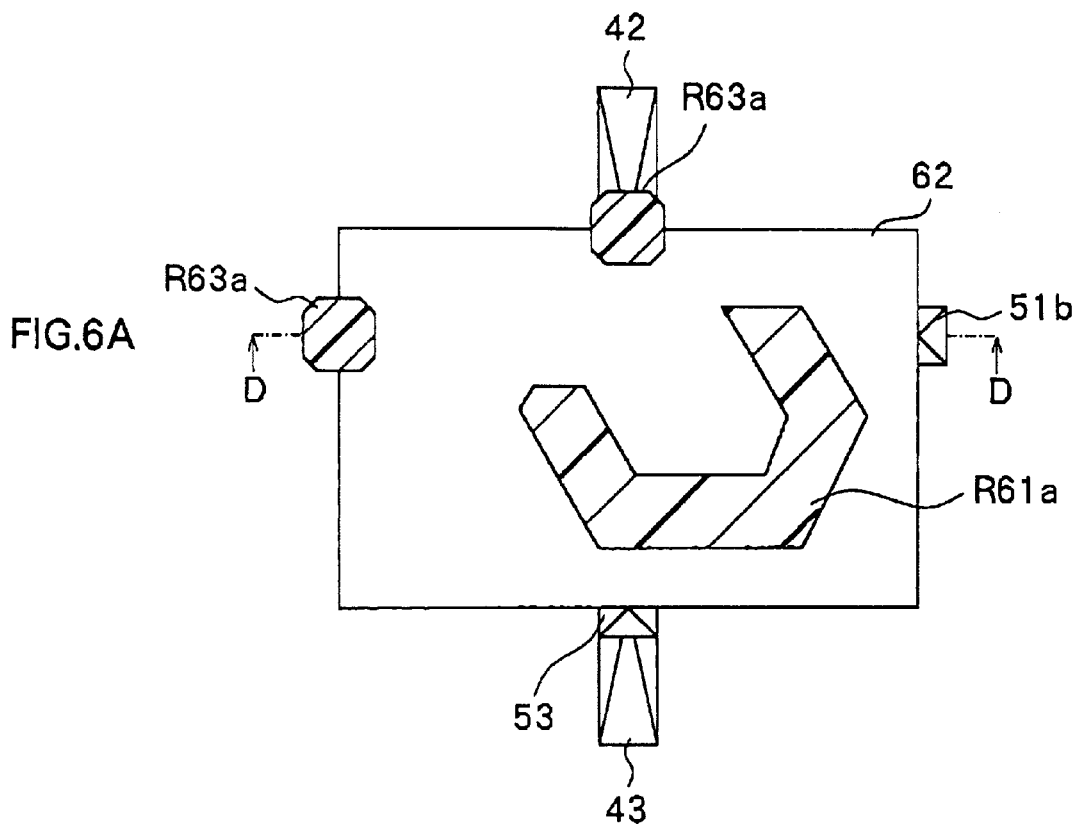
FIG. 6A is the plan view of the SRAM cell pattern, explaining a step following the step explained in FIG. 5A.
Figure 6B:
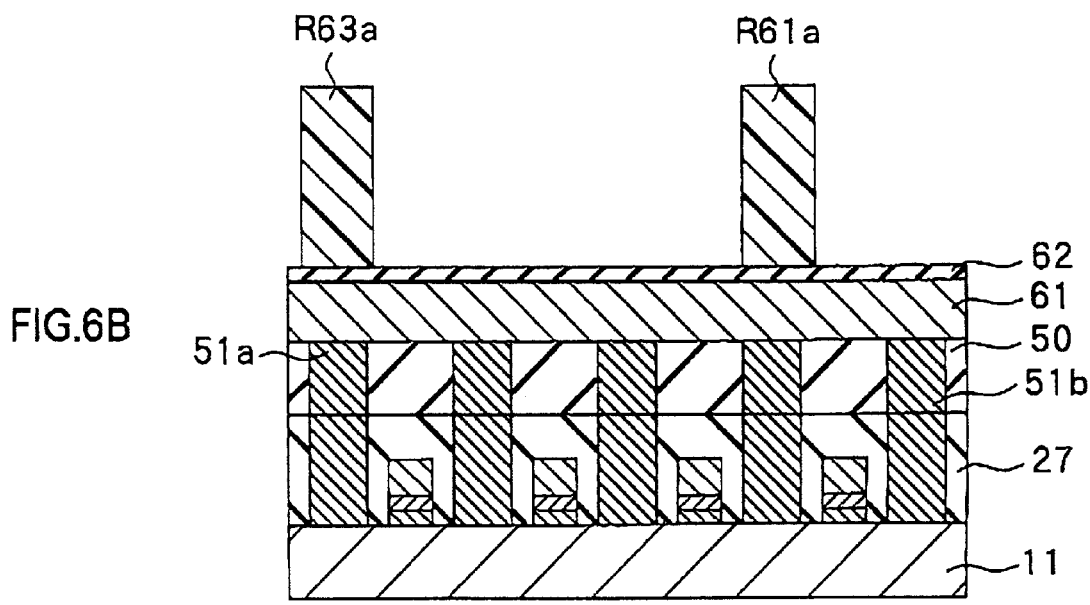
FIG. 6B is the cross sectional view of the SRAM cell pattern taken along the D—D line of FIG. 6A.

As illustrated in FIGS. 6A and 6B, a conductive film 61 for node wiring is formed on the second layer insulating film 50. The conductive film 61 is formed of, for example, titanium (Ti) about 50–200 nm thick or metal similar to titanium by a conventional semiconductor wiring process. After that, an etching protection film 62 for protecting the conductive film 61 at the time of etching is formed on the conductive film 61. For example, in the case where the conductive film 61 is metal wiring, a film which is hard to be etched at the time of etching metal wiring, such as a silicon dioxide ($SiO_2$) film, an organic film or a film having a character similar to that of these films is used. As described above, the lower conductive film 61 and upper etching protection film 62 are formed to have a double-structure for the node wiring. This is because, as described herein later, space between two sets of node wiring is made to be small, below the resolution limit of an exposure system by forming the two sets of node wiring using a photolithography process technique.

After forming the etching protection film 62, a resist pattern R61a is formed. The resist pattern R61a is used for forming one set of node wiring of the SRAM cell, that is, node wiring 61a to be described later (see FIG. 11), which connects the aforementioned n-type memory node contact 54b, p-type memory node contact 55b and gate electrode contact 56a. The resist pattern R61a is formed in a C shape, for example. In the embodiment, resist patterns R63a for forming landing pad layers to be described herein after are formed simultaneously with the resist pattern R61a. At this time, one resist pattern R63a is formed in a position in accordance with the bit line contact 51a, while the other resist pattern R63a is formed in a position in correspondence to the grounded line contact 52. Furthermore, the resist patterns R63a serving as landing pad layers have a greater area than each of the contacts in order to cope with a matching shift which occurs during patterning.

Figure 19:
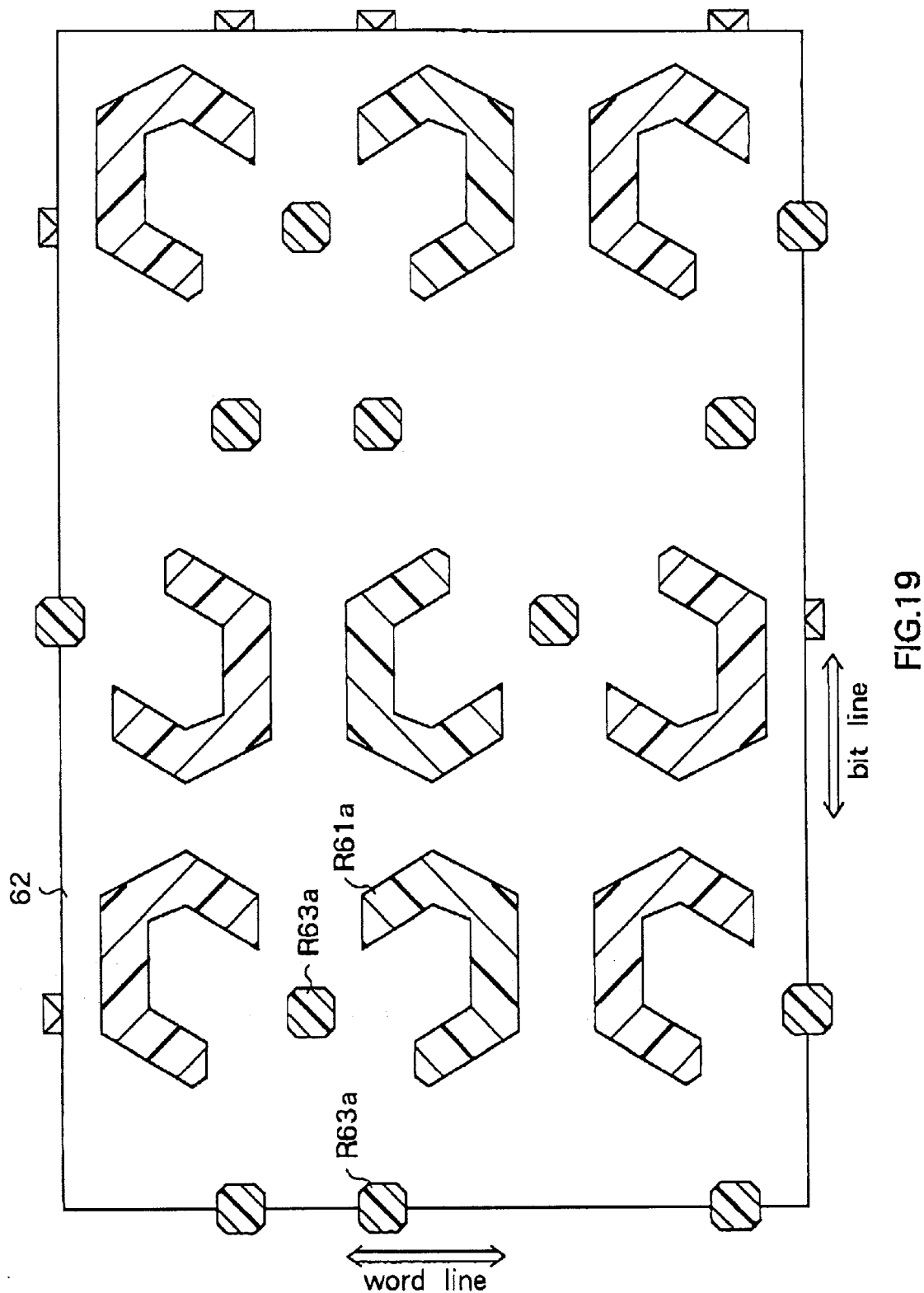
FIG. 19 is a plan view showing the whole SRAM cell patterns as corresponds to the step explained in FIG. 6.

FIG. 19 shows the plane configuration of the whole SRAM in this step. In this figure, the resist pattern R63a for the landing pad is provided in such a manner that neighboring memory cells share the resist pattern R63a. Assuming that one resist pattern R61a and two resist patterns R63a for constituting one memory cell comprise one unit, the cell including the resist pattern R61a and the two resist patterns R63a are positioned to by symmetrical with neighboring cells when revolving 180 degrees in a right-left direction in the figure (a direction along the bit line), while the cell is positioned in mirror symmetry with the neighboring cells in an up-down direction in the figure (a direction along the word line), i.e., the same pattern is alternately repeated. In other words, in this embodiment the resist pattern R61a having a roughly C shape is not placed in the same direction in all memory cells, but placed in a different direction between the neighboring cells in the up-down and right-left directions in the figure.

Incidentally, if the direction of the cell pattern is different in either up-down or right-left direction, the landing pad layers come close to both of the two sets of node wiring, similar to the conventional case such that all cell patterns are disposed in the same direction, thereby making it difficult for the landing pad layers and node wiring to be formed in the same step. Therefore, in the embodiment, the directions of the cell patterns are different in both the up-down and right-left direction, as described above.

Figure 7A:
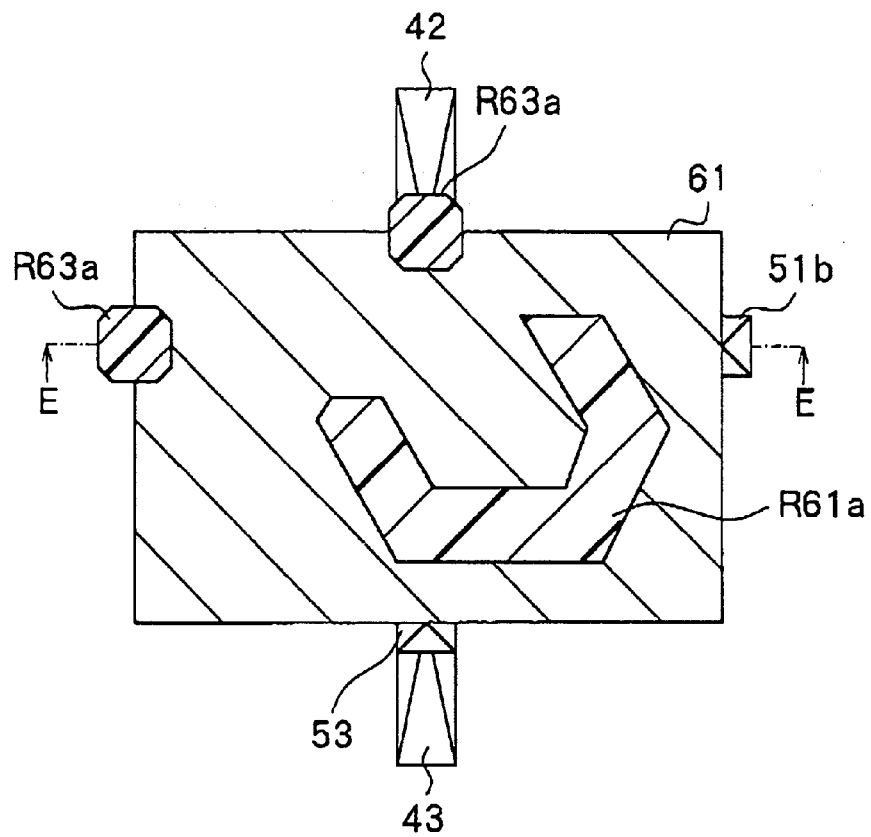
FIG. 7A is the plan view of the SRAM cell pattern, explaining a step following the step explained in FIG. 6A.
Figure 7B:
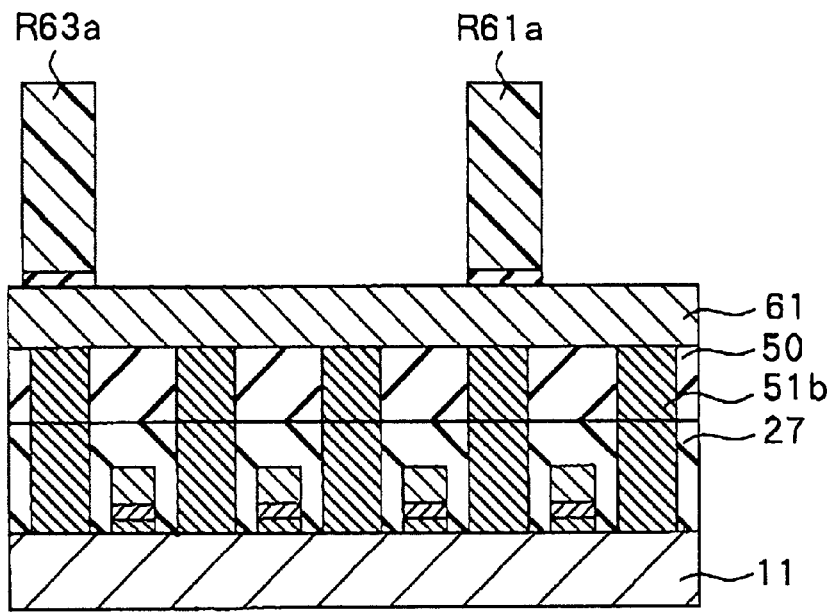
FIG. 7B is the cross sectional view of the SRAM cell pattern taken along the E—E line of FIG. 7A.
Figure 20:
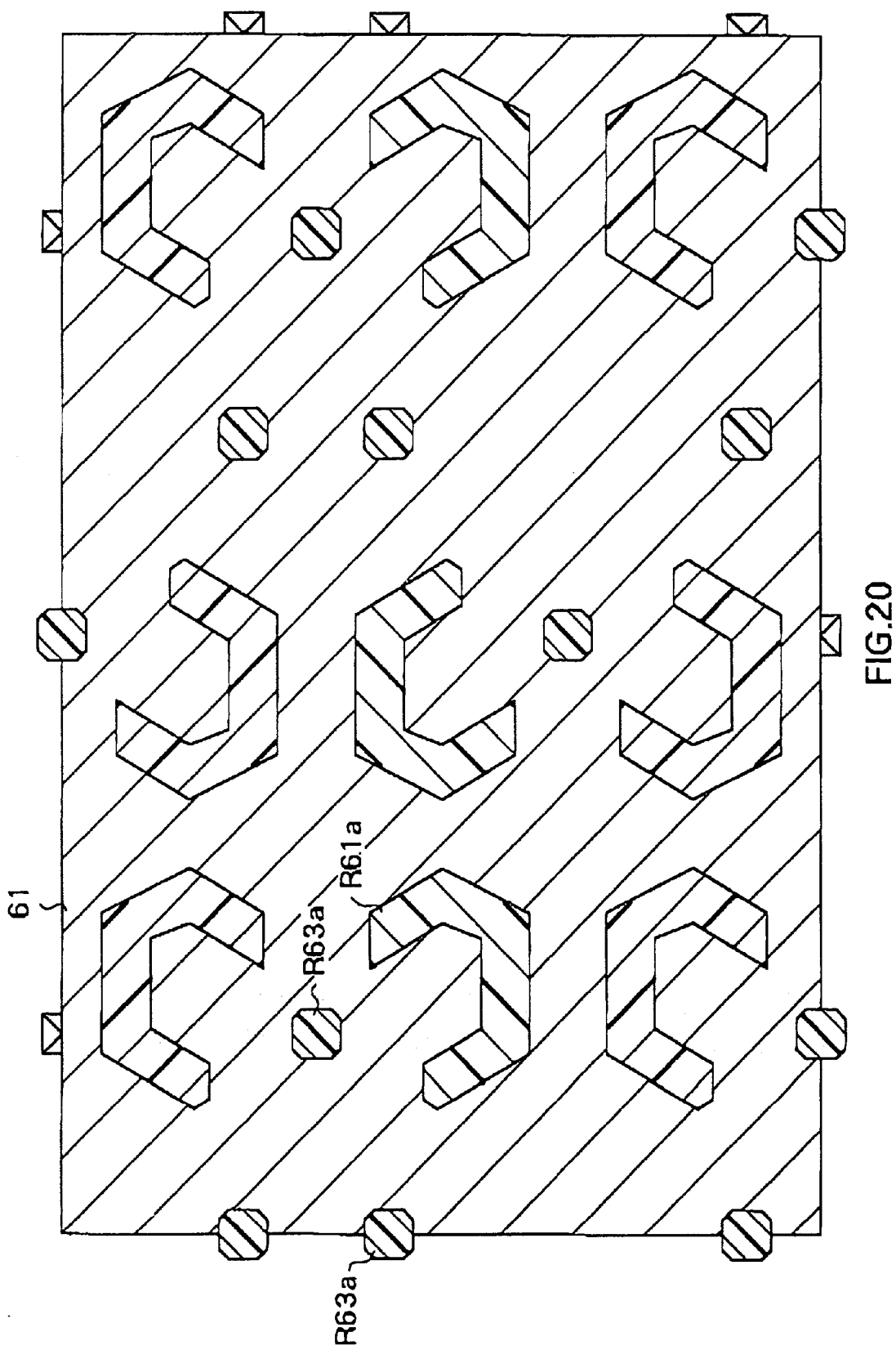
FIG. 20 is a plan view showing the whole SRAM cell patterns as corresponds to the step explained in FIG. 7.

Next, as shown in FIGS. 7A and 7B, the etching protection film 62 is etched using the resist patterns R61a and R63a as a mask. Here, since the etching protection film 62 is made of silicon dioxide ($SiO_2$) film, organic film or a material having a character similar to that of silicon dioxide ($SiO_2$) film or organic film as described hereinbefore, the etching of the etching protection film 62 stops before the conductive film 61 and thus the conductive film 61 is not subject to etching. FIG. 20 is the plane configuration of the whole SRAM in this step.

Figure 8A:
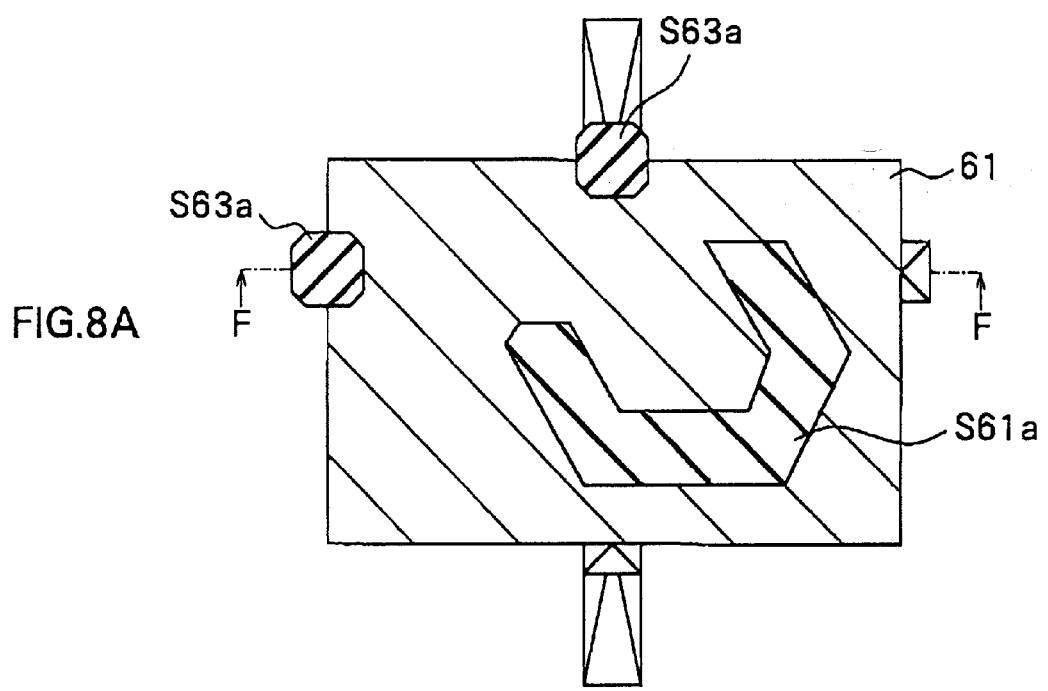
FIG. 8A is the plan view of the SRAM cell pattern, explaining a step following the step explained in FIG. 7A.
Figure 8B:
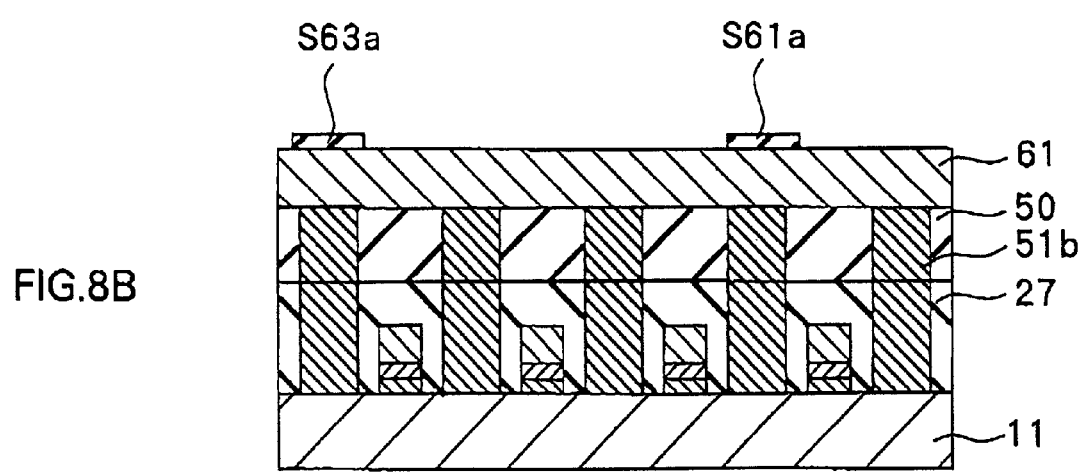
FIG. 8B is the cross sectional view of the SRAM cell pattern taken along the F—F line of FIG. 8A.
Figure 21:
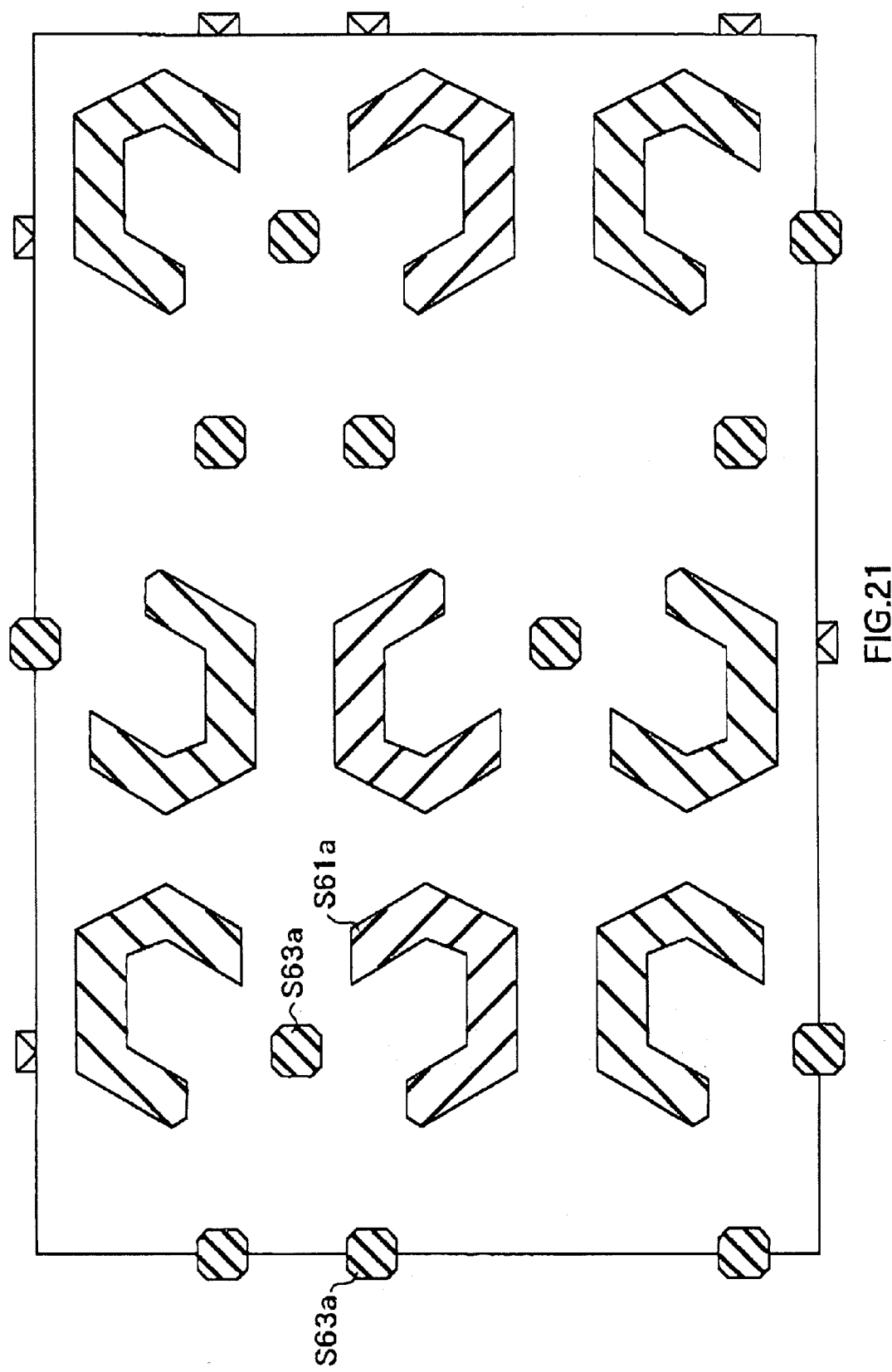
FIG. 21 is a plan view showing the whole SRAM cell patterns as corresponds to the step explained in FIG. 8.

Subsequently, after the resist patterns R61a and R63a are removed, protection film pattern S61a of the node wiring, and protection film patterns S63a of the landing pad layers are formed as shown in FIGS. 8A and 8B. FIG. 21 shows the plane configuration of the whole SRAM in this step.

Figure 9A:
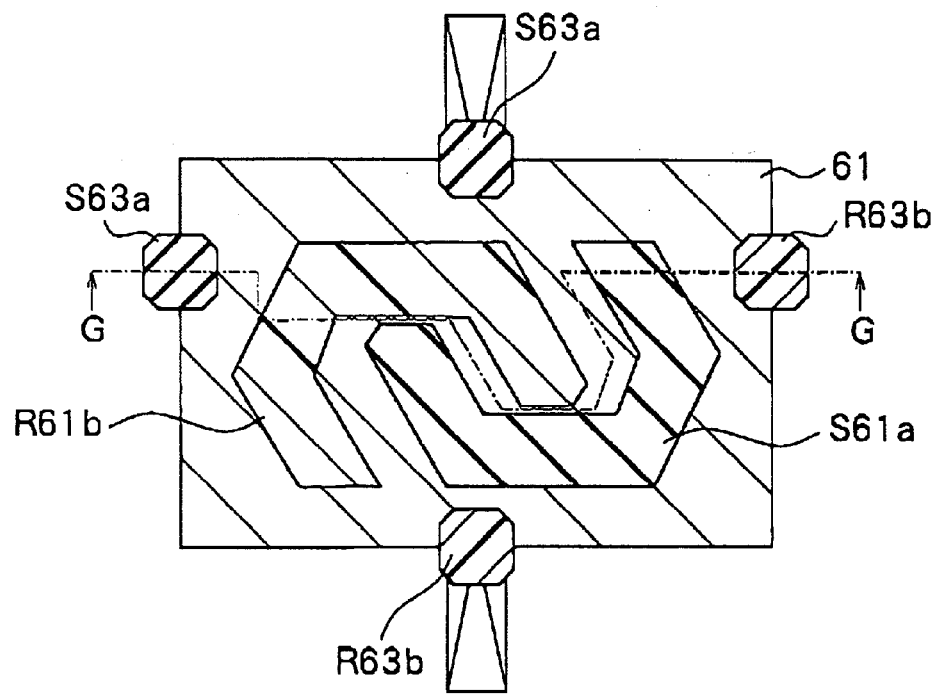
FIG. 9A is the plan view of the SRAM cell pattern, explaining a step following the step explained in FIG. 8A.
Figure 9B:
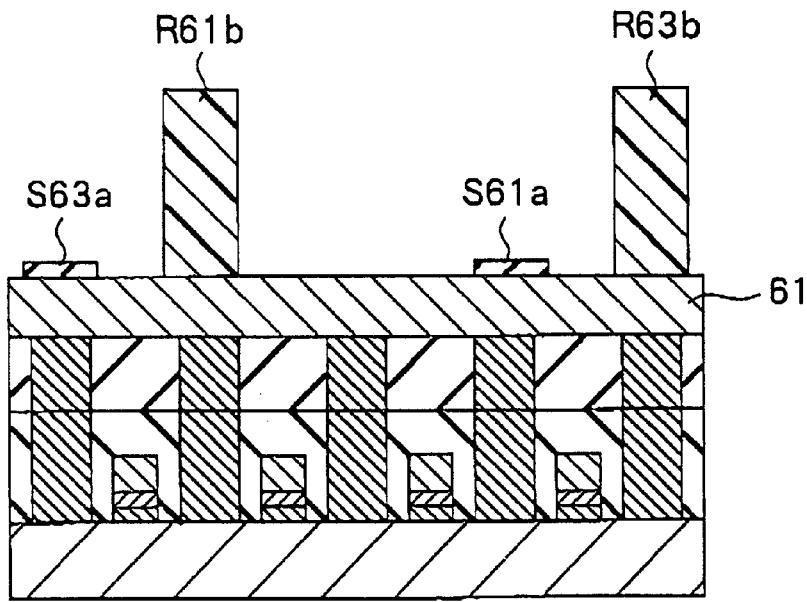
FIG. 9B is the cross sectional view of the SRAM cell pattern taken along the G—G line of FIG. 9A.

After the protection pattern S61a of the one set of node wiring and the protection film patterns S63a of the landing pad layers of the SRAM cell are formed as described above, the other resist pattern R61b is formed as shown in FIGS. 9A and 9B. This resist pattern R61b is used for forming node wiring 61b to be described herein below (see FIGS. 11A and 11B), e.g., the other node wiring to connect the above-mentioned n-type memory node contact 54a, p-type memory node contact 55a and gate electrode contact 56b. The resist pattern R61b is formed in a C shape similar to the resist pattern R61a, and provided in a direction so as to engage with the protection film pattern S61a in each cell. In the embodiment two resist patterns R63b for forming the landing pad layers to be described herein later are formed simultaneously with the resist pattern R61b. Here, the one resist pattern R63b is formed in a position corresponding to the bit line contact 51b and the other resist pattern R63b is formed in a position in accordance with the power supply voltage line contact 52. Similar to the resist patterns R63a, the resist patterns R63b serving as the landing pad layer have a greater area than each of the contacts so as to cope with the matching shift in patterning.

Figure 22:
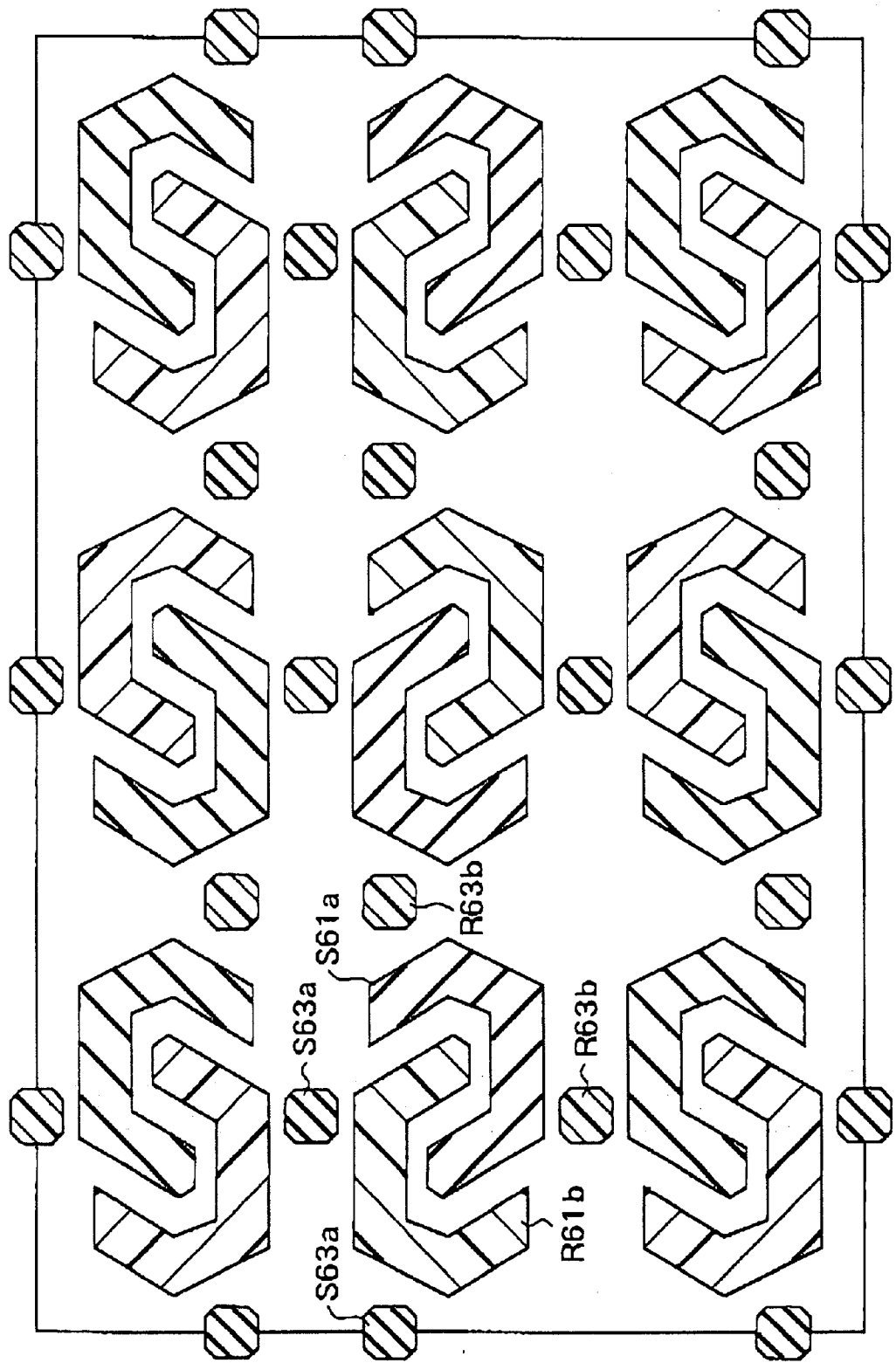
FIG. 22 is a plan view showing the whole SRAM cell patterns as corresponds to the step explained in FIG. 9.

FIG. 22 shows the plane configuration of the whole SRAM in this step. The resist pattern R63b is provided so that neighboring memory cells share the resist pattern R63b. Similar to the aforementioned resist patterns R61a and R63a, assuming that the one resist pattern R61b and the two resist patterns R63b for constituting the memory cell comprise one unit, the cells including the resist patterns R61a and R63a are disposed in different directions from each other between the neighboring cells in the up-down and right-left directions.

Figure 10A:
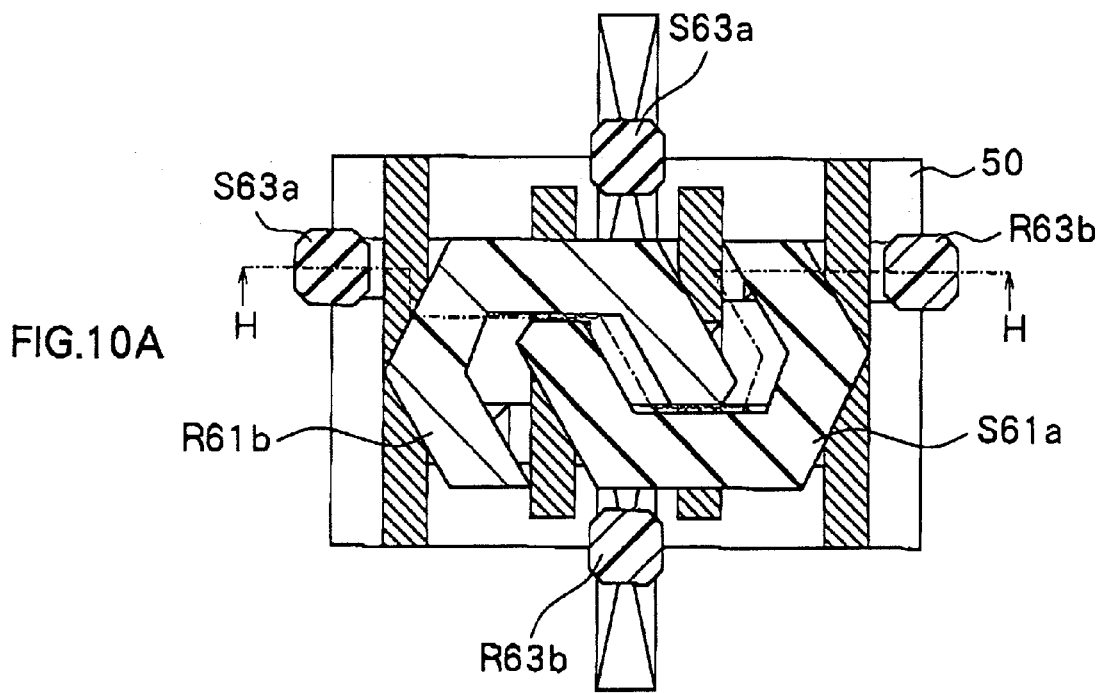
FIG. 10A is the plan view of the SRAM cell pattern, explaining a step following the step explained in FIG. 9A.
Figure 10B:
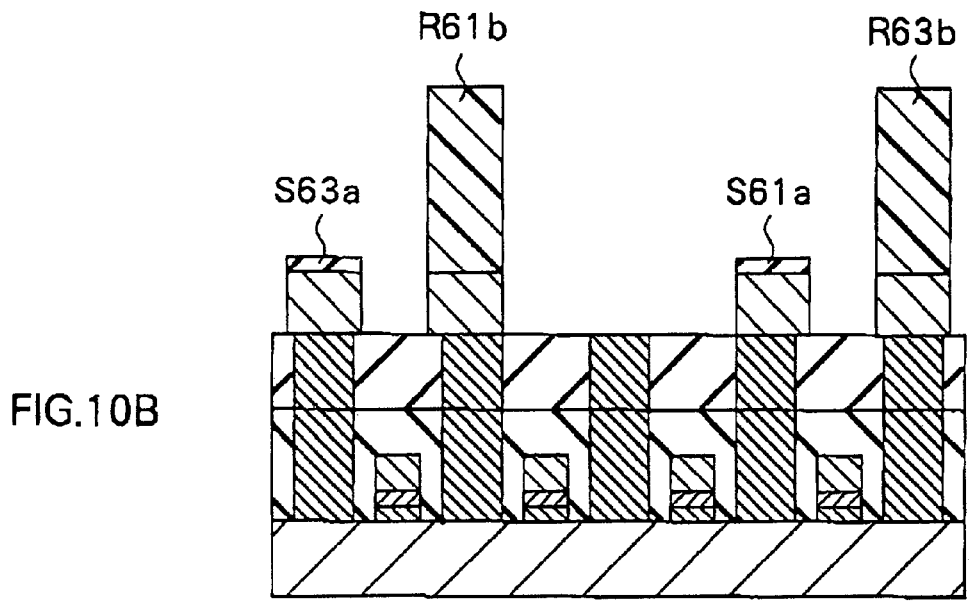
FIG. 10B is the cross sectional view of the SRAM cell pattern taken along the H—H line of FIG. 10A.
Figure 23:
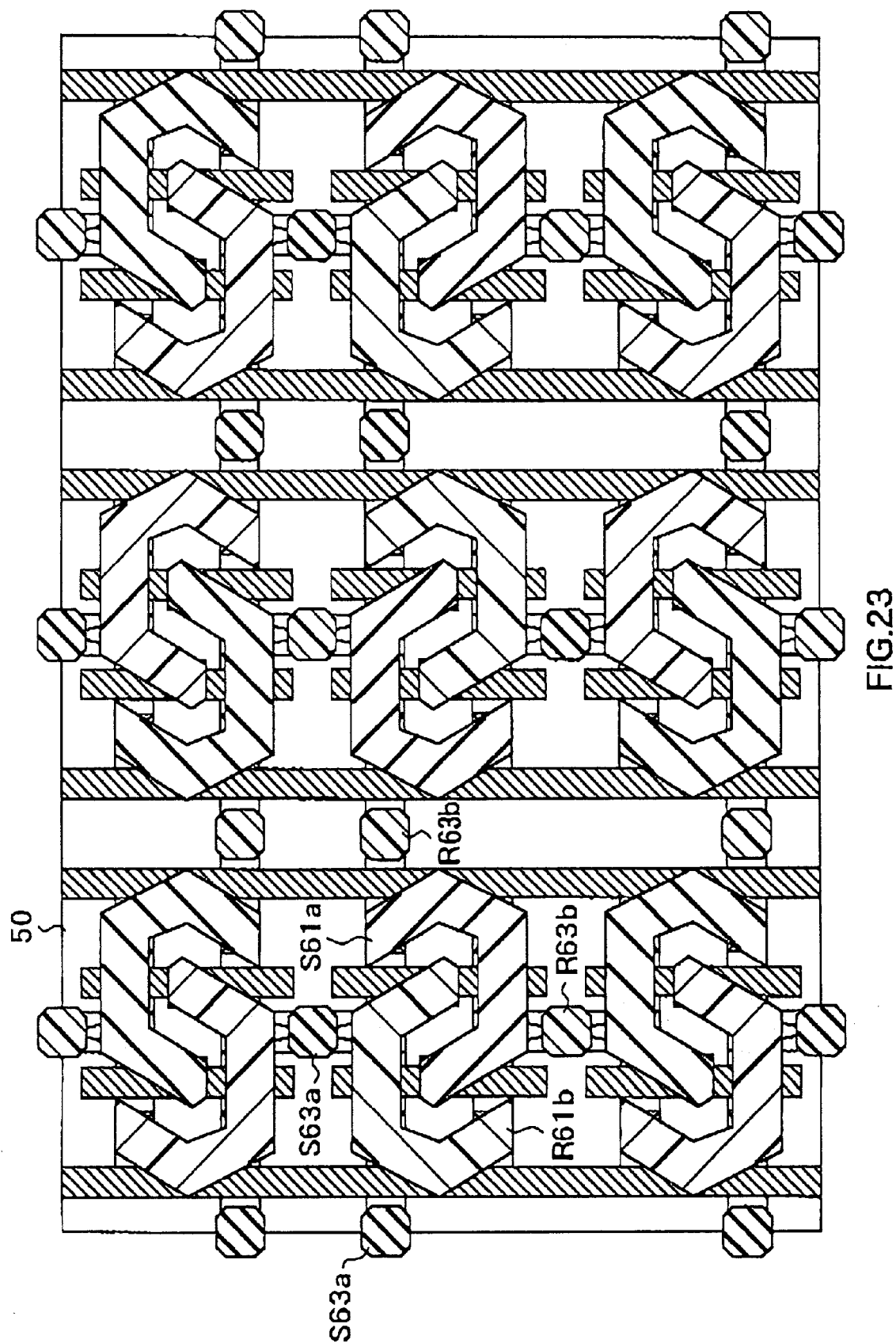
FIG. 23 is a plan view showing the whole SRAM cell patterns as corresponds to the step explained in FIG. 10.

As shown in FIGS. 10A and 10B, using the resist patterns R61b and R63b, the protection film pattern S61a for the node wiring and the protection film patterns S63a for the landing pad layer as the mask, the etching takes place and the conductive film 61 is selectively removed. FIG. 23 shows the plane configuration of the whole SRAM in this step.

Figure 11A:
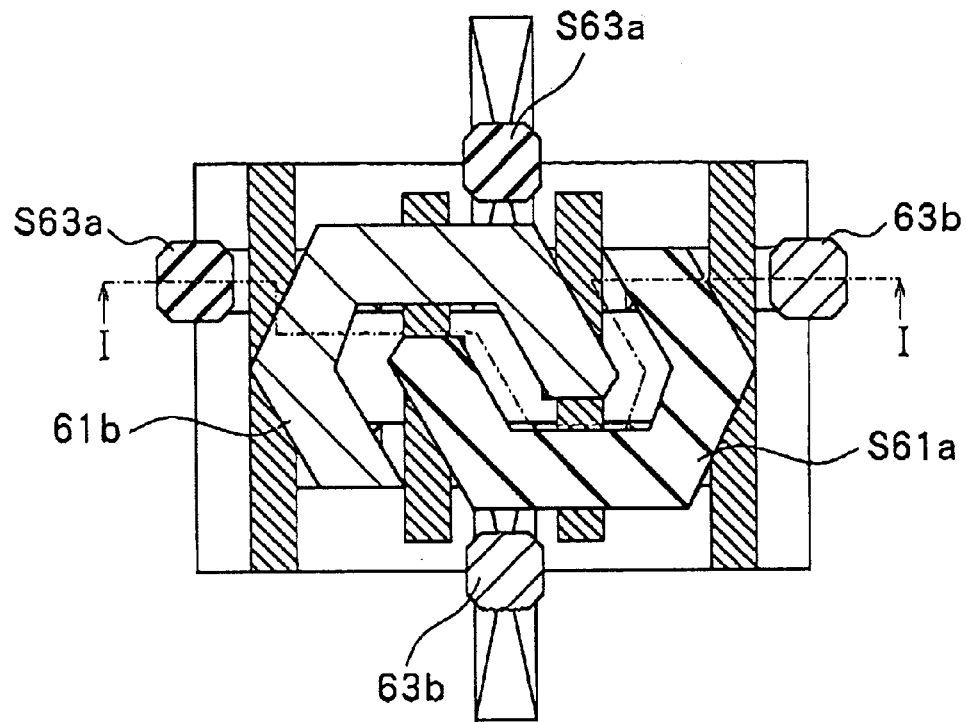
FIG. 11A is the plan view of the SRAM cell pattern, explaining a step following the step explained in FIG. 10A.
Figure 11B:
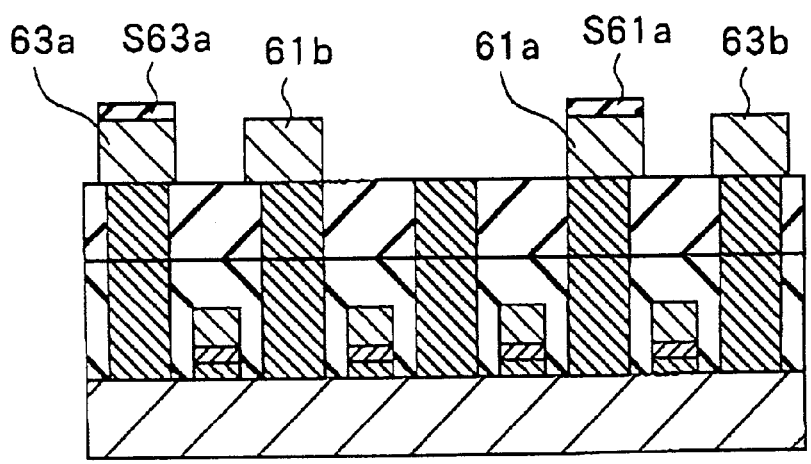
FIG. 11B is the cross sectional view of the SRAM cell pattern taken along the I—I line of FIG. 11A.
Figure 24:
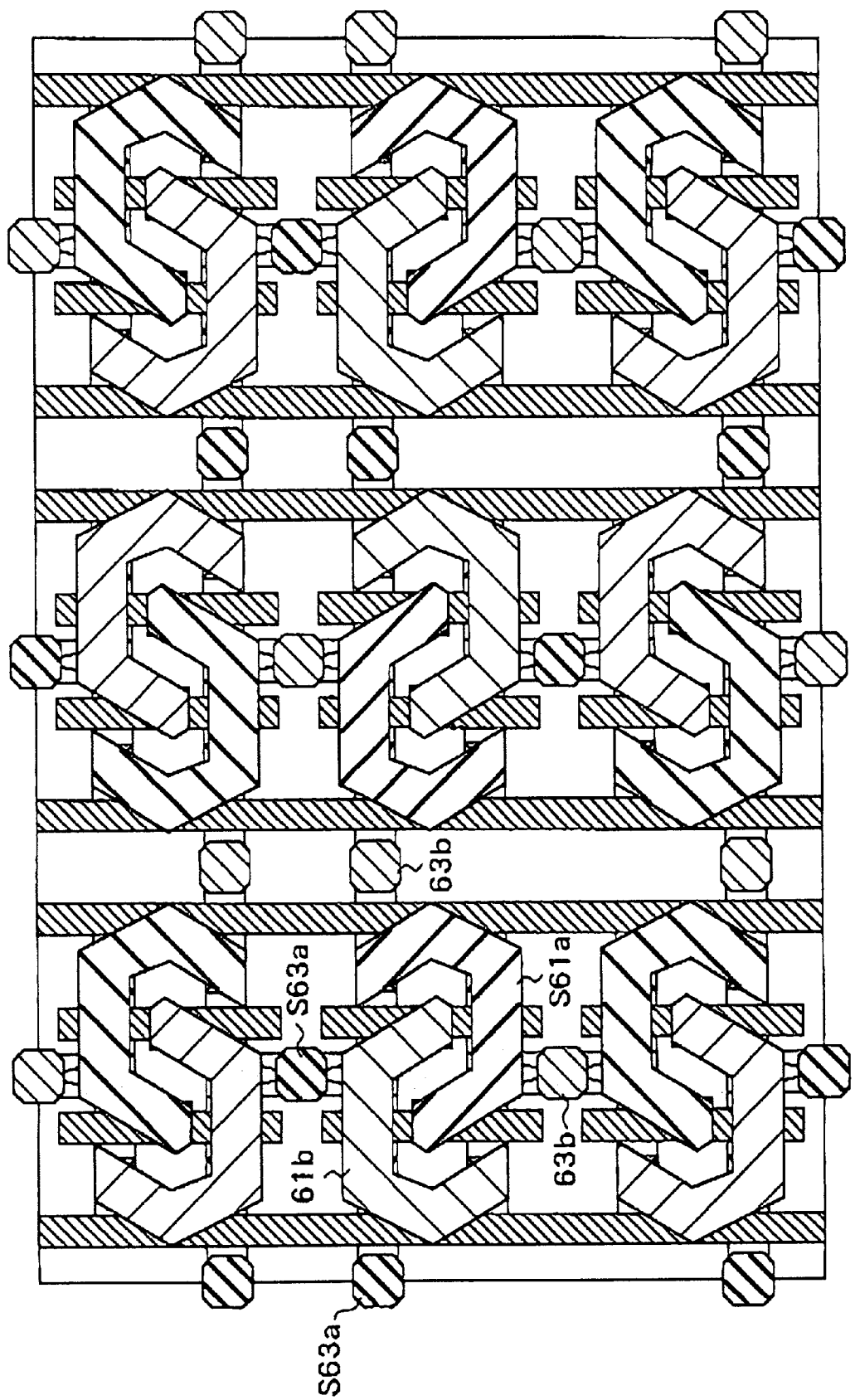
FIG. 24 is a plan view showing the whole SRAM cell patterns as corresponds to the step explained in FIG. 11.

Subsequently, the resist patterns R61b and R63b are removed. Then, as shown in FIGS. 11A and 11B the node wiring 61a and the node wiring 61b are formed, the node wiring 61a connecting the n-type memory node contact 54b, p-type memory node contact 55b and the gate electrode contact 56a, and the node wiring 61b connecting the n-type memory node contacts 54a, p-type memory node contact 55a and gate electrode contact 56b. Simultaneously, landing pad layers 63a are formed in a position in accordance with the bit line contact 51a and grounded line contact 52 and landing pad layers 63b are formed in a position in correspondence with the bit line contact 51b and power supply voltage line contact 53. FIG. 24 shows the plane configuration of the whole SRAM in this step.

At this time, in the case where the protection film patterns S61a and S63a are made of silicon dioxide ($SiO_2$) material, the protection film patterns S61a and S63a may remain or may be removed by reactive ion etching or the like after forming the node wiring 61a and 61b and landing pad layers 63a and 63b as described above. In the event that the protection film patterns S61a and S63a are made of organic material having less heat resistance, desirably the protection film patterns S61a and S63a are removed by reactive ion etching or the like.

Figure 12A:
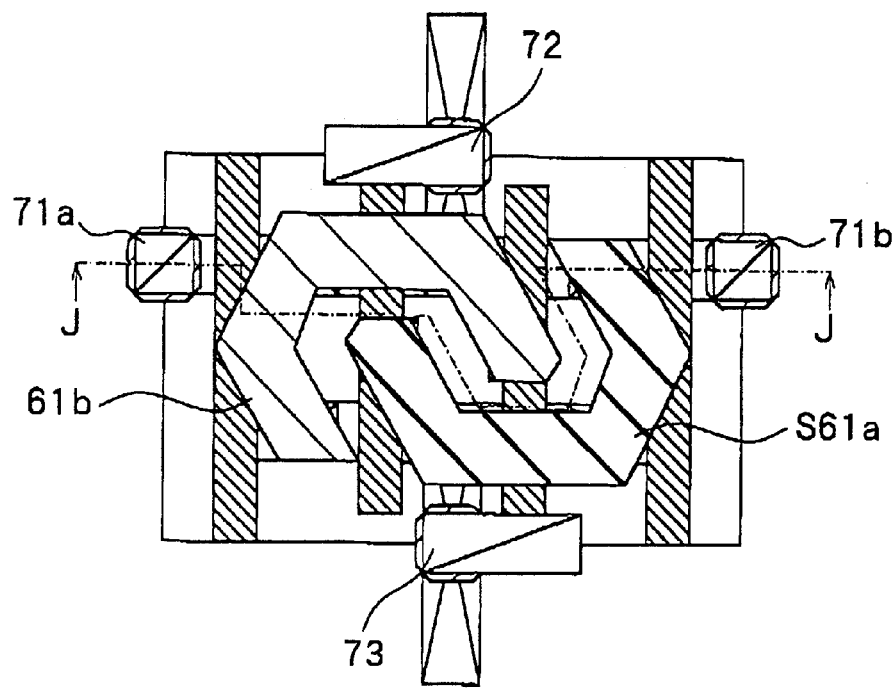
FIG. 12A is the plan view of the SRAM cell pattern, explaining a step following the step explained in FIG. 11A.
Figure 12B:
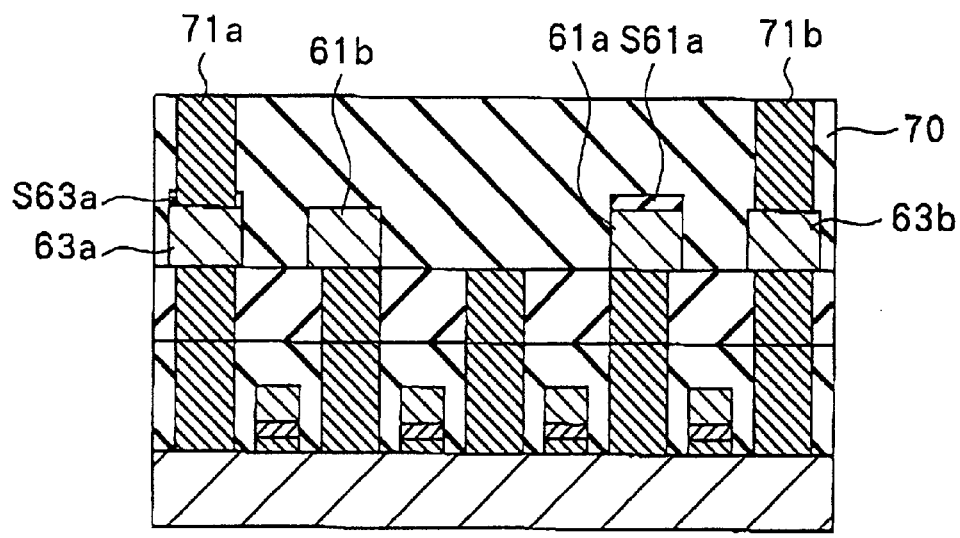
FIG. 12B is the cross sectional view of the SRAM cell pattern taken along the J—J line of FIG. 12A.
Figure 25:
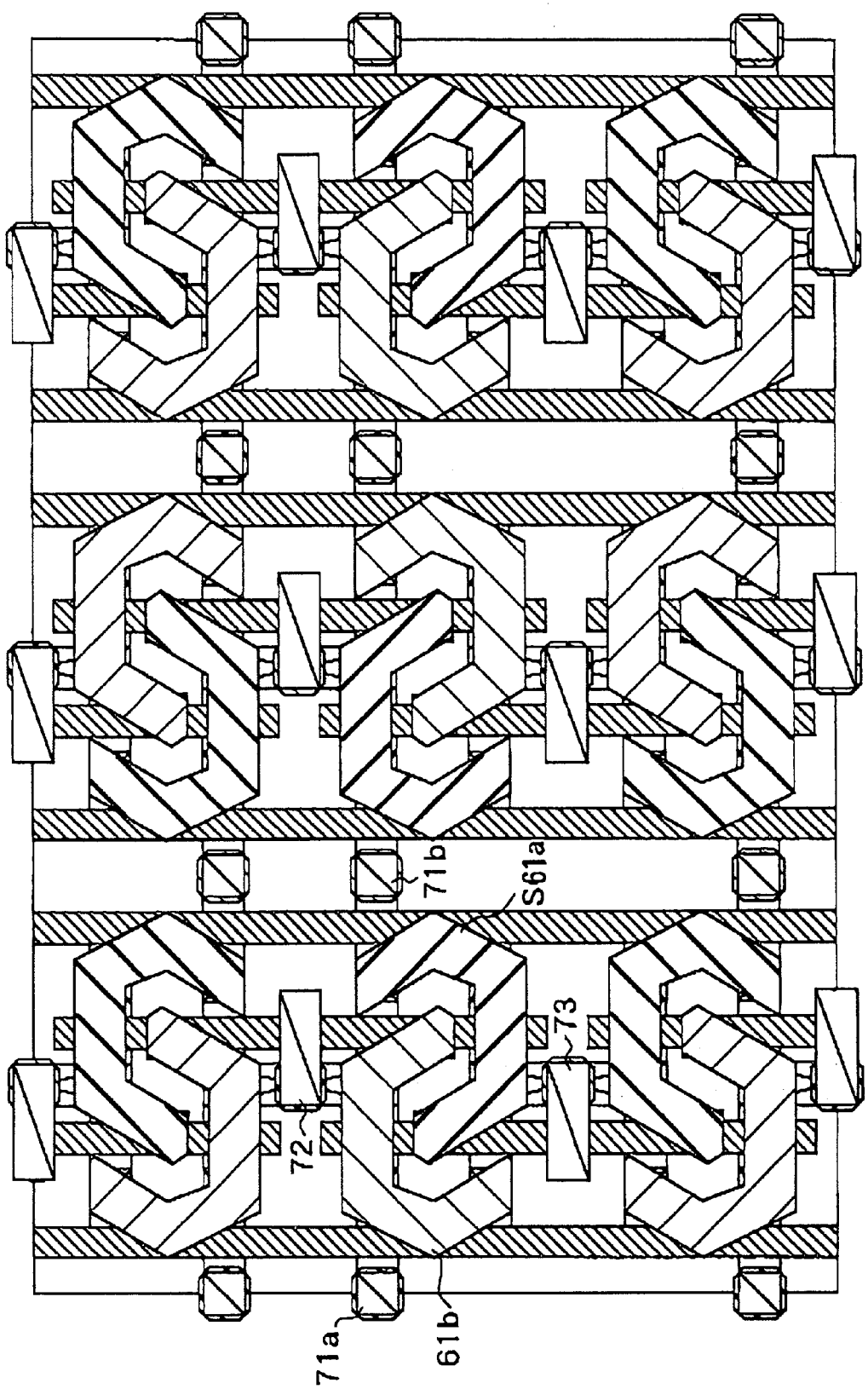
FIG. 25 is a plan view showing the whole SRAM cell patterns as corresponds to the step explained in FIG. 12.

As shown in FIGS. 12A and 12B, a third layer insulating film 70 is formed on the layer insulating film 50, the node wiring 61a and 61b and the landing pad layers 63a and 63b. After that, bit line contacts 71a and 71b are formed on the bit line contacts 51a and 51b, respectively. Further, a grounded line contact 72 and power supply voltage contact 73 are formed on the grounded line contact 52 and power supply voltage line contact 53, respectively. FIG. 25 shows the plane configuration of the whole SRAM in this step.

Figure 13A:
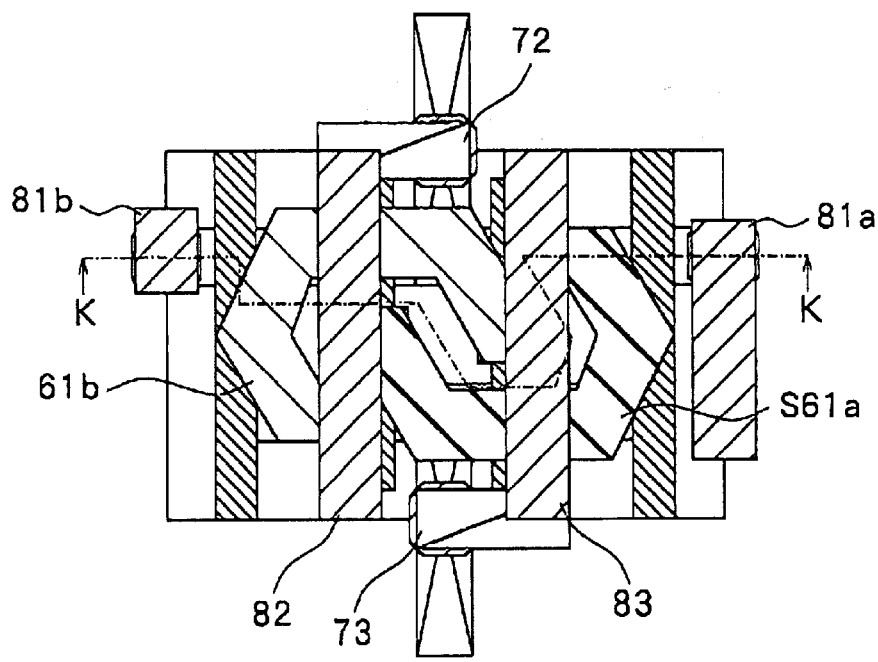
FIG. 13A is the plan view of the SRAM cell pattern, explaining a step following the step explained in FIG. 12A.
Figure 13B:
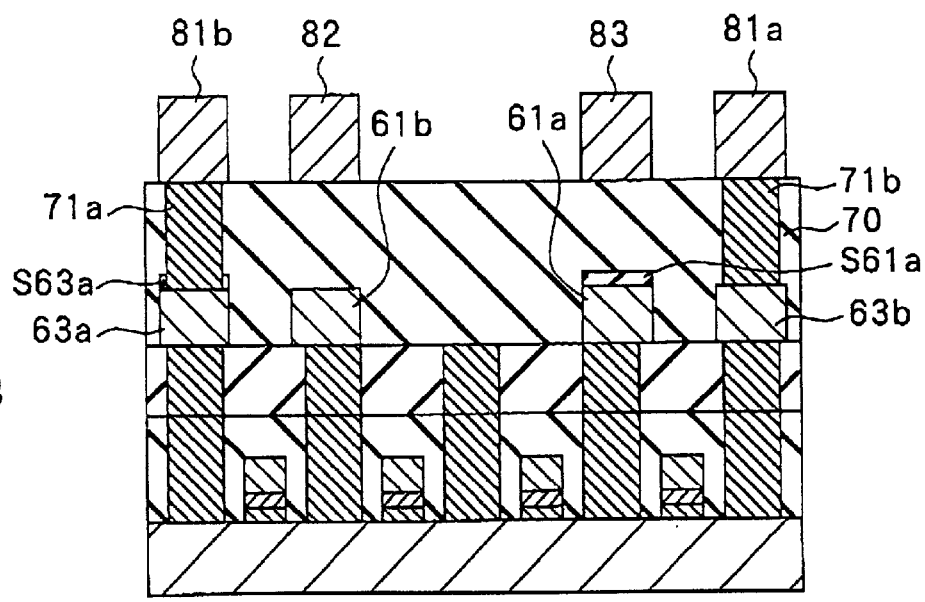
FIG. 13B is the cross sectional view of the SRAM cell pattern taken along the K—K line of FIG. 13A.
Figure 26:
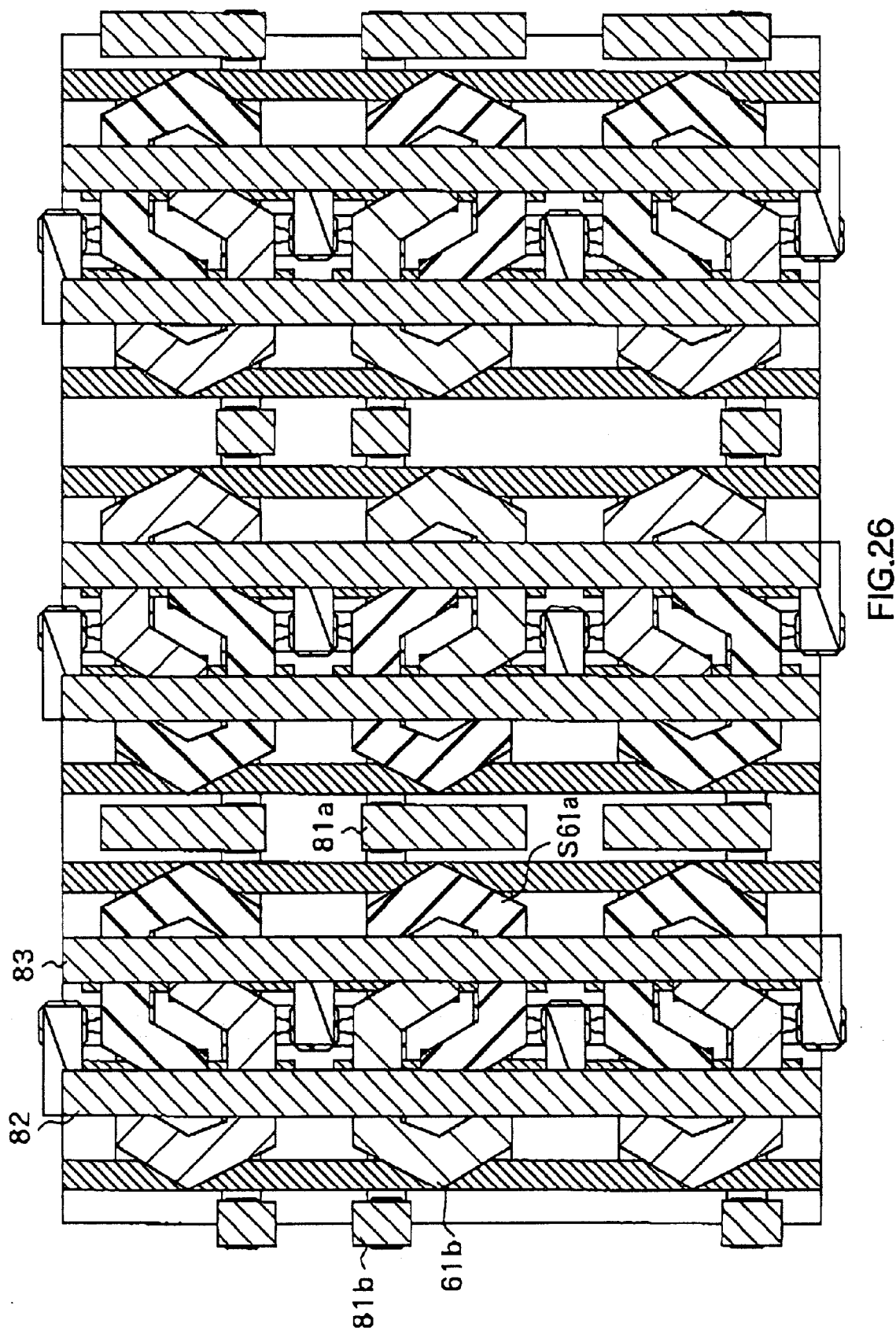
FIG. 26 is a plan view showing the whole SRAM cell patterns as corresponds to the step explained in FIG. 13.

Next, as shown in FIGS. 13A and 13B, bit line connection wiring 81a and 81b to be connected to the bit line contacts 71a and 71b, a grounded line 82 and power supply voltage line 83 to be connected to the grounded line contact 72 and power supply voltage contact 73 are formed, respectively. Wiring for lowering resistance (not shown) may be formed in each of the regions between the bit line connection wiring 81a and 81b, the grounded line 82 and the power supply voltage line 83. FIG. 26 shows the plane configuration of the whole SRAM in this step.

Figure 14A:
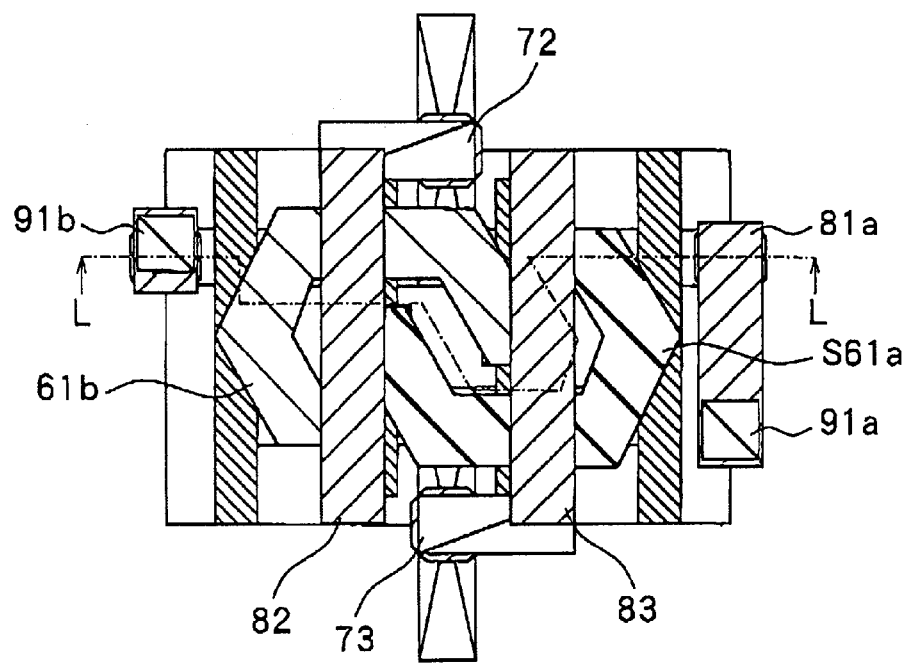
FIG. 14A is the plan view of the SRAM cell pattern, explaining a step following the step explained in FIG. 13A.
Figure 14B:
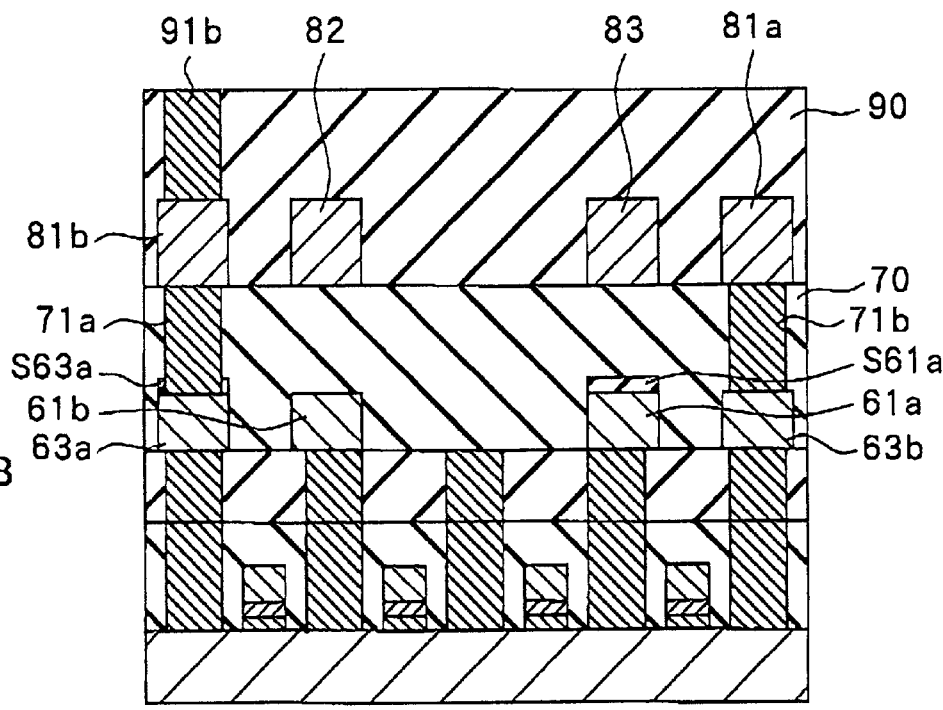
FIG. 14B is the cross sectional view of the SRAM cell pattern taken along the L—L line of FIG. 14A.
Figure 27:
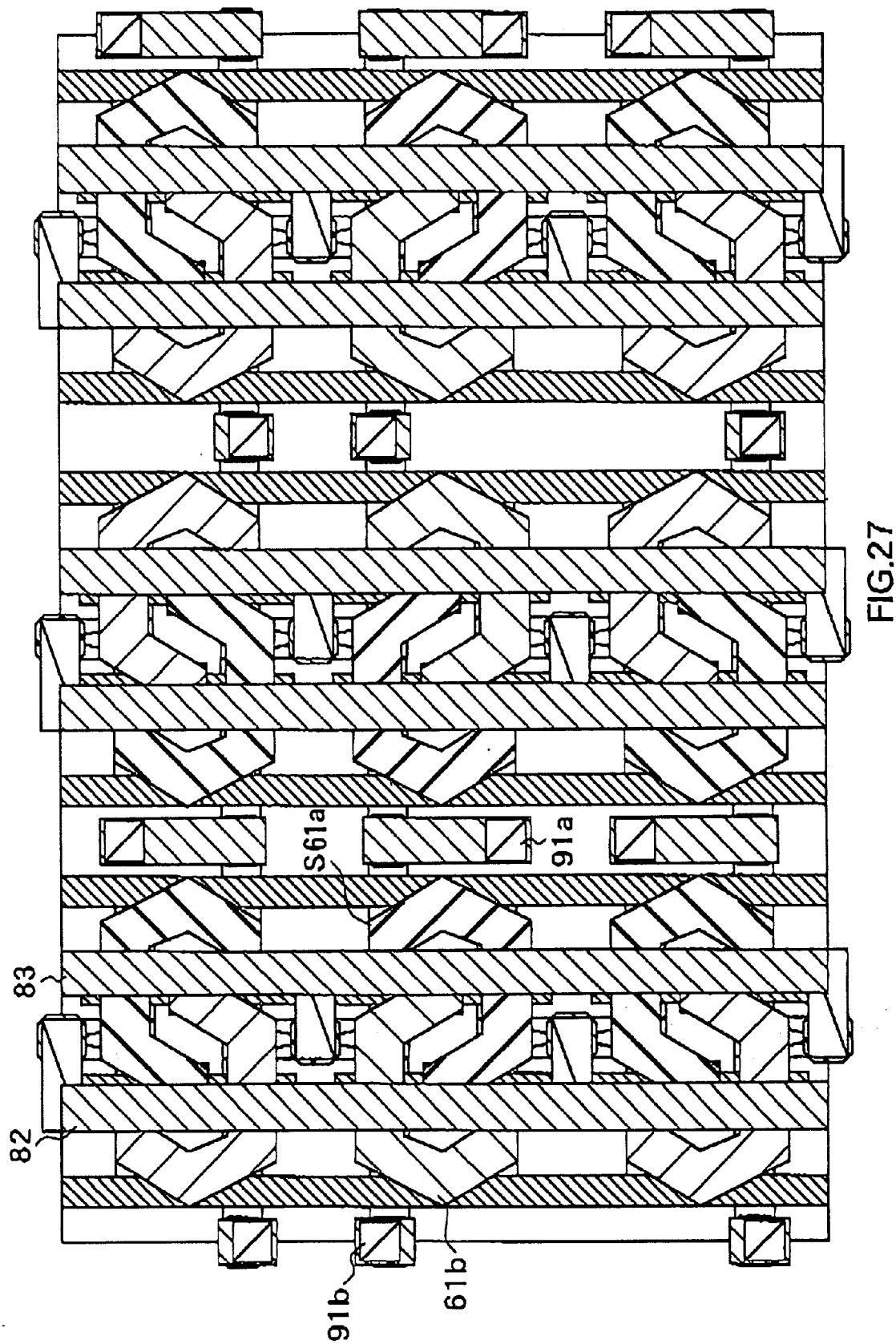
FIG. 27 is a plan view showing the whole SRAM cell patterns as corresponds to the step explained in FIG. 14.

As shown in FIGS. 14A and 14B, a layer insulating film 90 is formed on the layer insulating film 70 and wiring 81a, 81b, 82 and 83. Subsequently, bit line contacts 91a and 91b are formed on the bit line connection wiring 81a and 81b, respectively. FIG. 27 shows the plane configuration of the whole SRAM in this step.

Figure 15A:
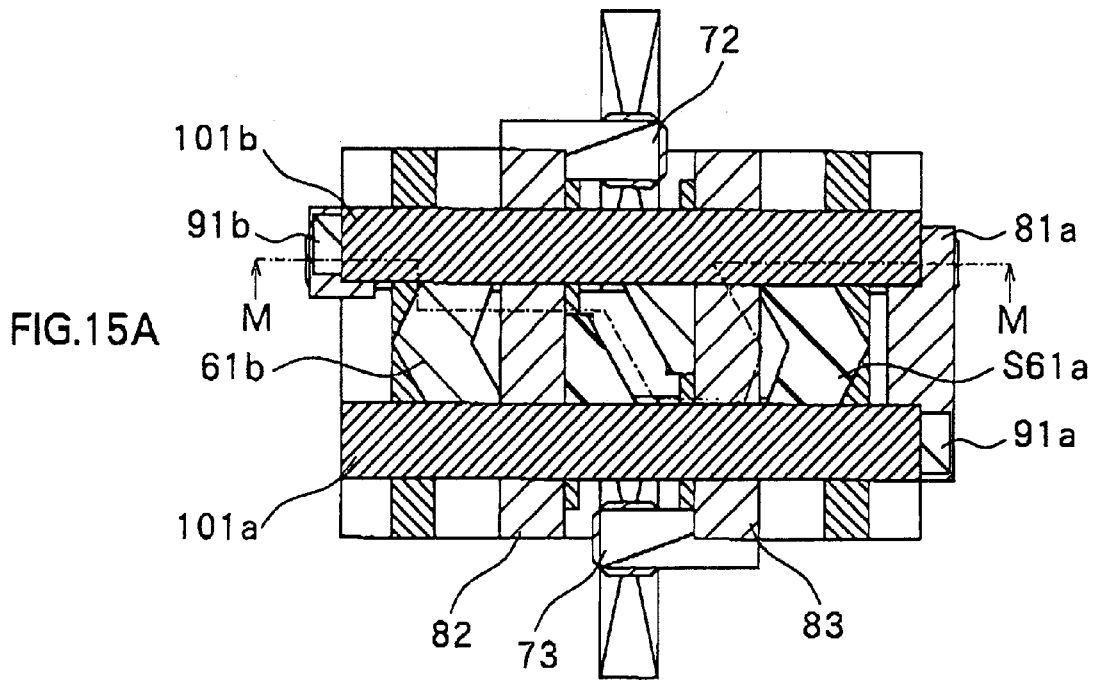
FIG. 15A is the plan view of the SRAM cell pattern, explaining a step following the step explained in FIG. 14A.
Figure 15B:
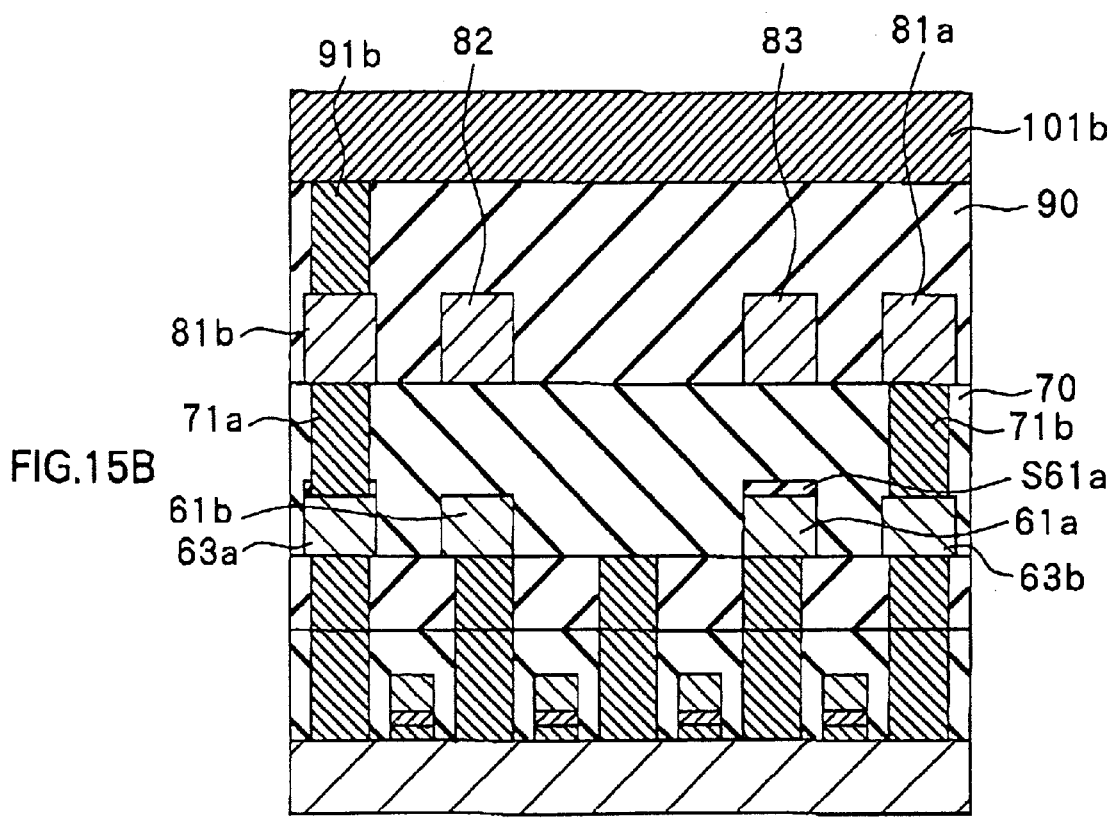
FIG. 15B is the cross sectional view of the SRAM cell pattern taken along the M—M line of FIG. 15A.
Figure 28:
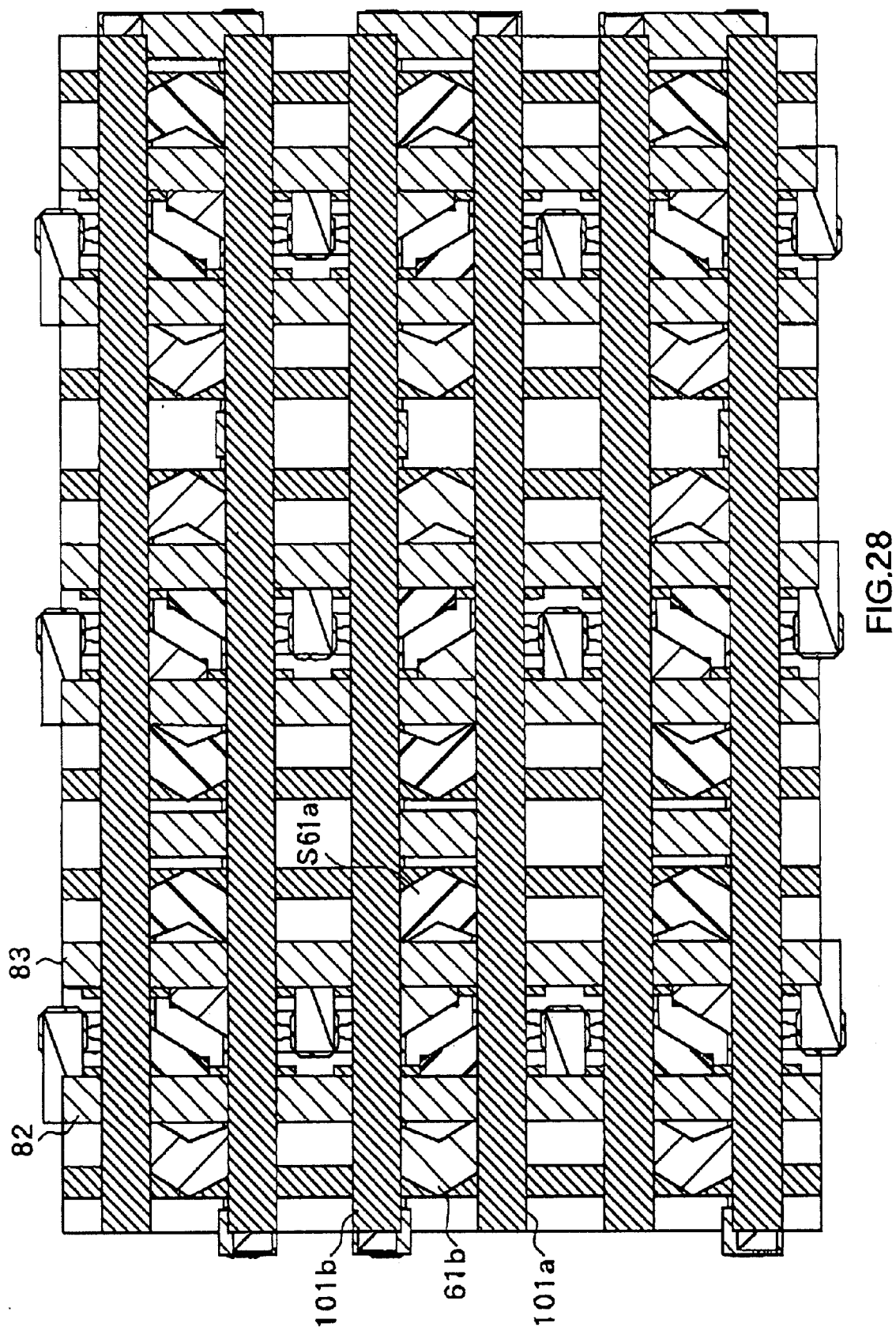
FIG. 28 is a plan view showing the whole SRAM cell patterns as corresponds to the step explained in FIG. 15.

Next, as shown in FIGS. 15A and 15B, bit lines 101a and 101b (BL1 and BL2) to be connected to the bit line contacts 91a and 91b are formed on the layer insulating film 90 and bit line contact 71a. FIG. 28 shows the plane configuration of the whole SRAM in this step.

Additionally, the above described contacts and wiring can be formed by the conventional semiconductor contact formation and wiring formation process. If necessary, the following step (not shown) is performed. A further upper wiring layer is formed. Thereafter, formation of an overcoat film, a window of he pads and the like are performed, and thereby a SRAM connection process is completed.

In the embodiment, as described above, the two sets of node wiring 61a and 61b are formed as follows: Firstly, the conductive film 61 to become the node wiring and the etching protection film 62 having the slower etching rate then the conductive film 61 are formed in sequence on the whole surface. Secondly, the etching mask layer (the protection film patterns S61a) is formed by processing the etching protection film 62 with the slower etching rate using the pattern of one set of node wiring 61a. Lastly, the two sets of node wiring 61a and 61b are formed by processing the conductive film 61 using the pattern of the other node wiring 61b, while protecting the conducive film 61 disposed immediately below the etching mask layer with the etching mask layer. Accordingly as compared with a conventional technique such that the node wiring is formed at the same time using a single photo mask, the node wiring pattern on the photo mask can have a pattern such that the space between the node wiring is made smaller by the amount that the space between resist patterns for the node wiring is reduced. The space between the node wiring can be made small irrelevant to the limit of exposure of the exposure system and thereby the cell size can be reduced.

Furthermore, in the embodiment, the resist patterns R61a and R61b having a roughly C shape, i.e., the patterns of the two sets of node wiring 61a and 61b and the resist patterns R63a and R63b, i.e., the patterns of the landing pad layers 63a and 63b are not disposed in the same direction in each memory cell, but placed in different directions from each other between the neighboring cells in the up-down and right-left direction, that is, symmetrical when revolving 180 degrees in the right-left directions, with mirror symmetry in the up-down direction. Furthermore, the resist patterns R63a and R63b, i.e., the patterns of the landing pad layers 63a and 63b, are formed so that the neighboring two cells in the right-left direction share the resist patterns R63a and R63b, i.e., the patterns for the landing pad layers 63a and 63b. Consequently, the landing pad layers 63a and 63b may be formed in the same layer as the node wiring 61a and 61b in accordance with the contacts connecting the grounded line, power supply voltage and bit line in the upper layer from the node wiring 61a and 61b.

Other embodiments of the invention will be described herein later. In the following embodiments, only pattern positions of each memory cell are different from the first embodiment, but other configurations are the same as those of the first embodiment. Therefore, in the following embodiments the same elements as those of the first embodiment are indicated by the same reference numerals and the detailed description is omitted.

The second embodiment

Figure 29:
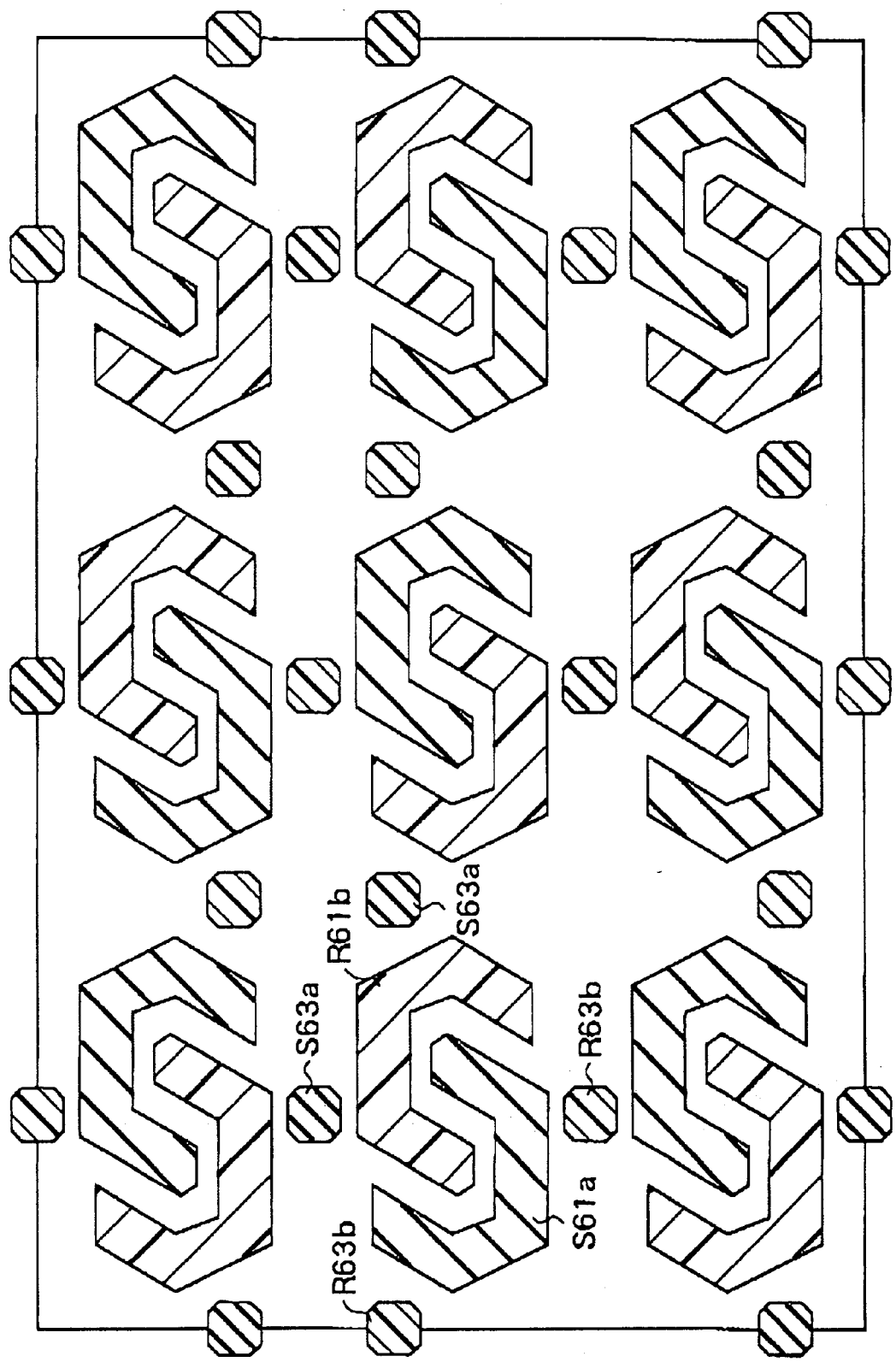
FIG. 29 is a plan view showing the whole SRAM cell patterns according to a second embodiment.

FIG. 29 shows the plane configuration of the whole SRAM according to a second embodiment of the invention.

In the first embodiment, the resist patterns R61a and R61b having the roughly C shape, i.e., the patterns of the node wiring 61a and 61b and the resist patterns R63a and R63b, i.e., the patterns of the landing pad layers 63a and 63b, are formed to be symmetrical when revolving 180 degrees between neighboring cells in the right-left direction with mirror symmetry between neighboring cells in the up-down direction. In this embodiment, however, the resist patterns are formed to be symmetrical to each other when revolving 180 degrees between neighboring cells in both right-left and up-down directions. FIG. 29 is a figure in correspondence with FIG. 22 of the first embodiment. Apparently from FIG. 29, the memory cell comprising a unit of patterns repeated one-dimensionally, is arranged to be symmetrical when revolving 180 degrees between neighboring memory cells in the right-left and up-down direction in the figure. In the embodiment, the node wiring 61a and 61b and the landing pad layers 63a and 63b are formed using the resist pattern illustrated in FIG. 29. Actions and effects of the embodiment are the same as those of the first embodiment and thus the description is omitted.

The third embodiment

Figure 30:
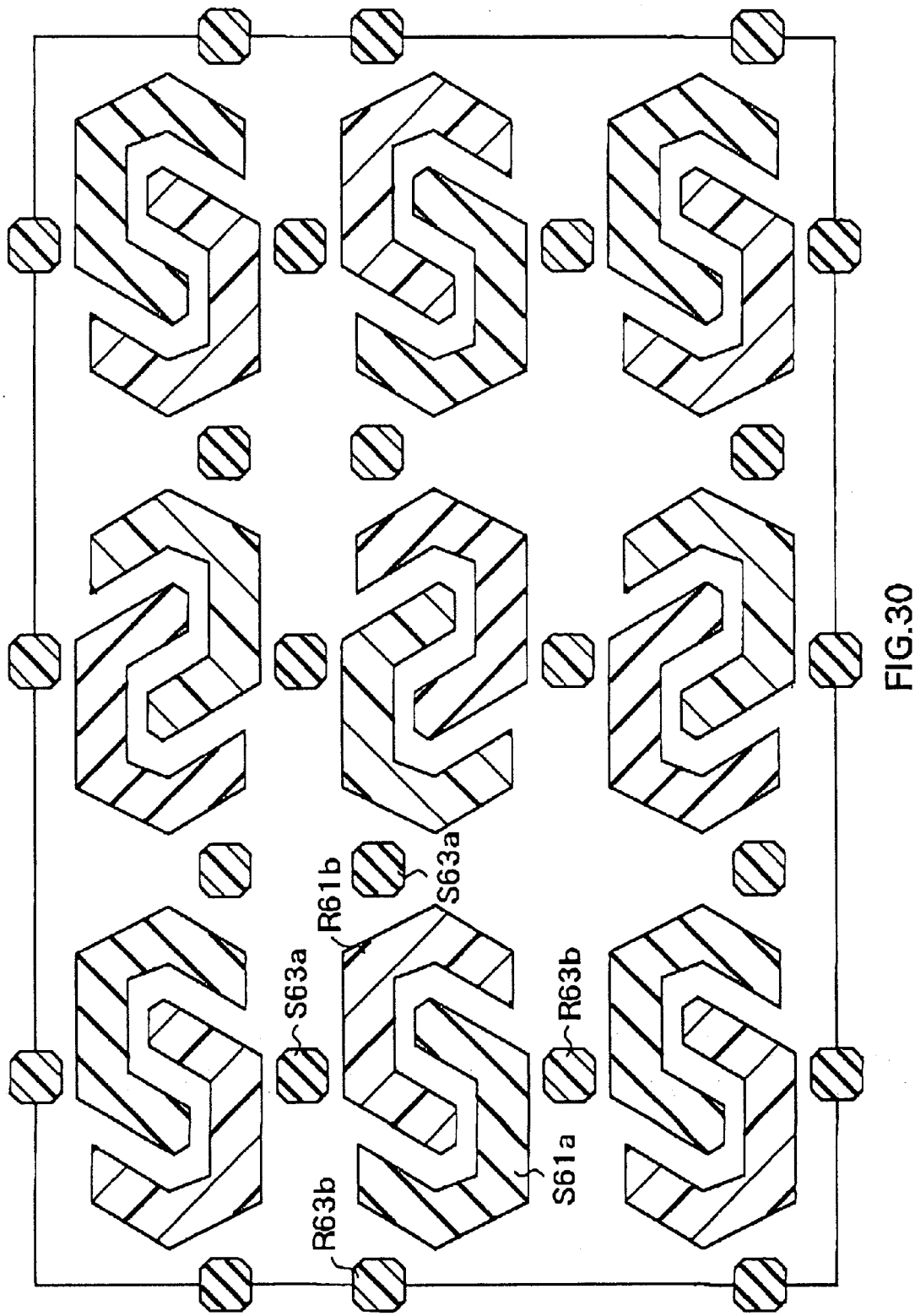
FIG. 30 is a plan view showing the whole SRAM cell patterns according to a third embodiment.

FIG. 30 shows the plane configuration of the whole SRAM according to a third embodiment of the invention.

In this embodiment, the resist patterns R61a and R61b having a roughly C shape, i.e., the pattern of the node wiring 61a and 61b, and the resist patterns R63a and R63b, i.e., the pattern of the landing pad layers 63a and 63b are formed to have mirror symmetry between neighboring cells in the right-left direction and symmetry when revolving 180 degrees between neighboring cells in up-down direction. FIG. 30 is also a figure which corresponds to FIG. 22 of the first embodiment. As apparent from FIG. 30, a memory cell composing a unit of patterns repeated one-dimensionally is disposed to have mirror symmetry with neighboring cells in the right-left direction and symmetry when revolving 180 degrees with neighboring cells in the up-down direction. In the invention, the node wiring 61a and 61b and the landing pad layers 63a and 63b are formed using the resist patterns shown in FIG. 30. Actions and effects of the embodiment are the same as those of the first embodiment and thus the description is omitted.

Figure 31:
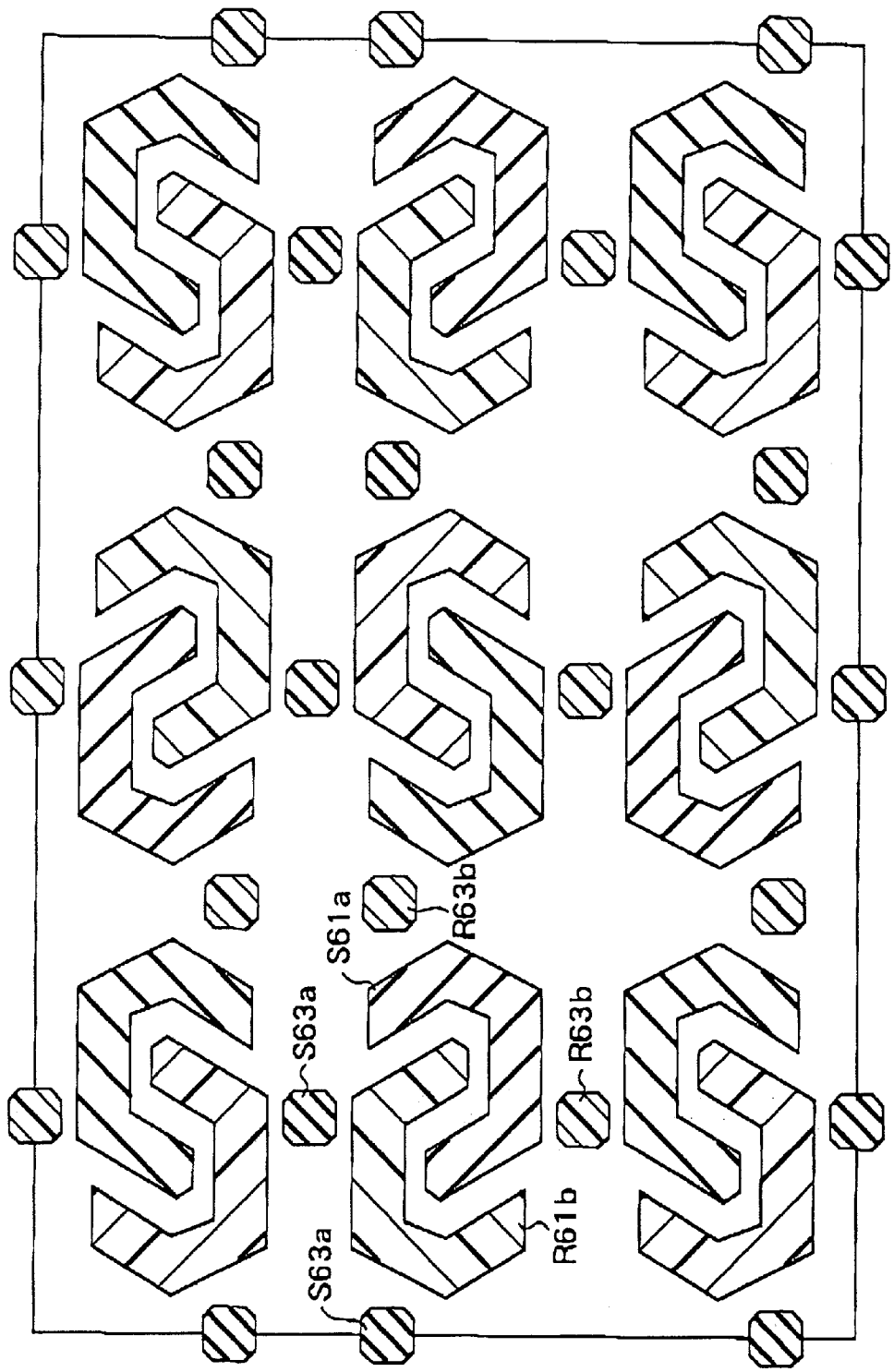
FIG. 31 is a plan view showing the whole SRAM cell patterns according to a fourth embodiment.

FIG. 31 shows the plane configuration of the whole SRAM according to a fourth embodiment of the invention.

In this embodiment, the resist patterns R61a and R61b with a roughly C shape, i.e., the patterns of the node wiring 61a and 61b and the resist patterns R63a and R63b, i.e., the patterns of landing pad layers 63a and 63b are formed to have mirror symmetry with each other between neighboring cells in the right-left and up-down directions. FIG. 31 is a figure which corresponds to FIG. 22 of the first embodiment. Apparently from FIG. 31, a memory cell composing a unit of patterns repeated one-dimensionally has a mirror symmetry relationship with neighboring cells in both right-left and up-down directions in the figure. The node wiring 61a and 61b and landing pad layers 63a and 63b are also formed using the resist pattern shown in FIG. 31 in the embodiment. Actions and effects of the embodiment are the same as those of the first embodiment and thus the description is omitted.

Each of the node wiring and landing pad layers is not limited to the shapes in the above-described embodiments. It goes without saying that shapes with some modification are included.

As described hereinbefore the semiconductor memory device of the invention, each pattern of two sets of node wiring is disposed to have a different direction from each other between neighboring cells. Further, the two sets of node wiring are formed so as to have the same pattern with a roughly C shape, respectively and these two patterns with a roughly C shape are disposed to engage with each other. Hence, it is possible to have a configuration including the landing pad layer made of the same conductive material as the node wiring in the same layers as the two sets of node wiring, and cope with the slight matching shift at the time of forming the contacts as well. Moreover, the manufacturing process is simplified. The cell size is reduced and thus high integration is realized.

In the method of manufacturing the semiconductor memory device according to the invention, the first and second node wiring are formed separately in two steps of patterning. As a result, the node wiring pattern on the photomask may have a pattern such that the space between the node wiring is made smaller by the amount that the space between resist patterns of the node wiring is reduced and therefore the space between the node wiring can be made small irrelevant to the limit of exposure of the exposure system.

Furthermore, the pattern of the first node wiring is formed in a roughly C shape and out of four sides of each memory cell the first landing pad layers are arranged on the two sides opposite the two sides close to the node wiring. The patterns of the first node wiring and the first landing pad layers are arranged to have different directions between neighboring cells. The pattern of the second node wiring is formed to have a roughly C shape engaging with the first node wiring. The second landing pad layers are disposed out of four sides of each cell on the two sides opposite the two sides close to the second node wiring. The patterns of the second node wiring and the second landing pad layers are arranged to have different directions between neighboring cells. As a result, the first and second landing pad layers may be formed in the same layer as well as in the same step as the first and second node wiring with wide margin. Accordingly, together with the node wiring, the landing pad layers can be easily formed in correspondence with the contacts connecting to the grounded line, power supply voltage line and bit line, and thereby the manufacturing process is simplified and high integration is made feasible.

Obviously many modifications and variations of the present invention are possible in the light of the above teachings. It is therefore to be understood that within the scope of the appended claims the invention may be practiced otherwise than as specifically described.

What is claimed is:

1. A semiconductor memory device including in each cell two inverters in which input and output terminals are connected crossing over each other by first node wiring and second node wiring, each of the two inverters consisting of a first conductive drive transistor and a second conductive load transistor which are connected in series between a first power supply voltage line to supply a first power voltage and a second power supply voltage line to supply a second power supply voltage, where for each of the two inverters a gate line is connected to and serves as a gate electrode for the first conductive drive transistor and the second conductive load transistor, wherein each pattern of the first node wiring and second node wiring has the same shape in each cell and is disposed to have a different direction from each other between neighboring cells, with a space between the first node wiring and the second node wiring being smaller than a width of either node wiring, a first active region in which a channel of the drive transistor is formed and a second active region in which a channel of the load transistor is formed are disposed in each cell in such a manner that current directions of each channel of the drive transistor and the load transistor are parallel to each other in each cell, each drive transistor of the two inverters is arranged in series, word transistors are arranged so that word lines separately placed in each word transistor are orthogonal to the first active region at both ends of the cell, respectively.

2. A semiconductor memory device according to claim 1, wherein a first active region in which a channel of the drive transistor is formed and a second active region in which a channel of the load transistor is formed are disposed in each cell in such a manner that current directions of each channel of the drive transistor and the load transistor are parallel to each other in each cell, each drive transistor of the two inverters is arranged in series, and word transistors are arranged so that word lines are orthogonal to the first active region at both ends of the cell, respectively.

3. A semiconductor memory device according to claim 1, wherein a landing pad layer formed of the same conductive material as the node wiring in the same layer as that of the node wiring is provided in each cell.

4. A semiconductor memory device according to claim 3, wherein the landing pad layers are formed as an individual pattern on contacts which correspond to the first power supply voltage line, the second power supply voltage line and the bit line, respectively.

5. A semiconductor memory device according to claim 4, wherein the landing pad layers are shared among cells adjacent to each other in four sides of each memory cell, and the first node wiring and the second node wiring are surrounded by the landing pad layers.

6. A semiconductor memory device according to claim 5, wherein the four landing pad layers are composed of two first landing pad layers and two second landing pad layers, the two first landing pad layers being formed on a first two sides, out of four sides of each memory cell, opposite a second two sides close to the first node wiring, and being formed in the same step as the first node wiring, and the two second landing pad layers being formed on the second two sides opposite the first tow sides close to the second node wiring, and being formed in the same step as the second node wiring.

7. A semiconductor memory device according to claim 6, wherein each of the node wiring is formed in the same pattern having a roughly C shape, and the two patterns with a roughly C shape are arranged to engage with each other.

8. A semiconductor memory device accordingly to claim 7, wherein between two neighboring memory cells in a direction along which the bit wiring extends, positions of each pattern of the first node wiring, the first landing pad layers, the second node wiring and the second landing pad layers are symmetrical to each other when revolving 180 degrees with the center of the cell being an axis, and between two neighboring memory cells in a direction along which the word lines extend, the word lines being orthogonal to the bit wiring, positions of each pattern of the first node wiring, the first landing pad layers, the second node wiring and the second landing pad layers have mirror symmetry to each other.

9. A semiconductor memory device according to claim 7, wherein between two neighboring memory cells in a direction along which the bit wiring extends, positions of each pattern of the first node wiring, the first landing pad layers, the second node wiring and the second landing pad layers are symmetrical to each other when revolving 180 degrees with the center of the cell being an axis, and between two neighboring memory cells in a direction along which the word lines extend, the word lines being orthogonal to the bit wiring, positions of each pattern of the first node wiring, the first landing pad layers, the second node wiring and the second landing pad layers are symmetrical to each other when revolving 180 degrees with the center of the cell being an axis.

10. A semiconductor memory device according to claim 7, wherein between two neighboring memory cells in a direction along which the bit wiring extends, positions of each pattern of the first node wiring, the first landing pad layers, the second node wiring and the second landing pad layers have mirror symmetry to each other, and between two neighbor memory cells in a direction along which the word lines extend, the word lines being orthogonal to the bit wiring, positions of each pattern of the first node wiring, the first landing pad layers, the second node wiring and the second landing pad layers are symmetrical to each other when revolving 180 degrees with the center of the cell being an axis.

11. A semiconductor memory device according to claim 7, wherein between two neighboring memory cells in a direction along which the bit wiring extends, positions of each pattern of the first node wiring, the first landing pad layers, the second node wiring and second landing pad layers have mirror symmetry to each other, and between two neighboring memory cells in a direction along which the word lines extend, the word lines being orthogonal to the bit wiring, positions of each pattern of the first node wiring, the first landing pad layers, the second node wiring and the second landing pad layers have mirror symmetry to each other.

12. A semiconductor memory device according to claim 1, wherein space between the first node wiring and the second node wiring is smaller than the width of the node wiring itself.

* * * * *

UNITED STATES PATENT AND TRADEMARK OFFICE
CERTIFICATE OF CORRECTION

PATENT NO.     : 6,525,382 B1                                            Page 1 of 1
DATED          : February 25, 2003
INVENTOR(S)    : Minoru Ishida It is certified that error appears in the above-identified patent and that said Letters Patent is hereby corrected as shown below:

Column 14,
Line 3, replace "first tow sides" with -- first two sides --.

Signed and Sealed this

Twenty-fifth Day of November, 2003

JAMES E. ROGAN
*Director of the United States Patent and Trademark Office*